(12) United States Patent
Kakumu et al.

(10) Patent No.: US 12,676,183 B2
(45) Date of Patent: Jul. 7, 2026

(54) SEMICONDUCTOR MEMORY CELL HAVING TWO GATES AND ONE CHANNEL LAYER

(71) Applicant: Unisantis Electronics Singapore Pte. Ltd., Singapore (SG)

(72) Inventors: Masakazu Kakumu, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 114 days.

(21) Appl. No.: 18/676,782

(22) Filed: May 29, 2024

(65) Prior Publication Data

US 2024/0404583 A1     Dec. 5, 2024

(51) Int. Cl.
*G11C 11/4096* (2006.01)
*H10B 12/00* (2023.01)
(Continued)

(52) U.S. Cl.
CPC .......... *G11C 11/4096* (2013.01); *H10B 12/20* (2023.02); *H10B 69/00* (2023.02); *H10W 20/435* (2026.01)

(58) Field of Classification Search
CPC . G11C 11/4096; H01L 23/5283; H10B 12/20; H10B 69/00
See application file for complete search history.

(56) References Cited

U.S. PATENT DOCUMENTS

| | | |
|---|---|---|
| 2003/0111681 A1 | 6/2003 | Kawanaka |
| 2006/0157738 A1 | 7/2006 | Kawanaka |

(Continued)

FOREIGN PATENT DOCUMENTS

| | | |
|---|---|---|
| JP | 02-188966 | 7/1990 |
| JP | 2003-188279 A | 7/2003 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991) (6 pages).

(Continued)

*Primary Examiner* — Alexander Sofocleous
*Assistant Examiner* — Joseph Fidelis Stormes
(74) *Attorney, Agent, or Firm* — Crowell & Moring LLP

(57) ABSTRACT

In a semiconductor memory device, an n-type semiconductor layer is formed on a p-type semiconductor region on a substrate, a p-type first semiconductor layer having a columnar shape and concave top surface extends vertically from part of the n-type semiconductor layer, the p-type first semiconductor layer and n-type semiconductor layer are partially covered with an insulating layer, a first gate insulating layer is placed in contact with the p-type first semiconductor layer, a first gate conductor layer is placed in contact with the first gate insulating layer, and a second gate insulating layer, a second gate conductor layer, and an access transistor with an n+ layer provided on both sides are installed along a surface of the p-type first semiconductor layer.

14 Claims, 32 Drawing Sheets

(51) Int. Cl.
  H10B 69/00     (2023.01)
  H10W 20/41     (2026.01)

(56)         References Cited

U.S. PATENT DOCUMENTS

| | | | |
|---|---|---|---|
| 2008/0137394 A1 | 6/2008 | Shimano et al. | |
| 2008/0205133 A1 | 8/2008 | Gonzalez et al. | |
| 2011/0241105 A1* | 10/2011 | Renn | H10B 12/20 |
| | | | 257/330 |
| 2012/0056255 A1 | 3/2012 | Sukekawa | |
| 2014/0355349 A1* | 12/2014 | Maejima | G11C 16/0483 |
| | | | 365/185.11 |
| 2020/0135863 A1 | 4/2020 | Han et al. | |
| 2023/0077140 A1 | 3/2023 | Kakumu et al. | |
| 2023/0282576 A1* | 9/2023 | Yang | H10D 30/6733 |

FOREIGN PATENT DOCUMENTS

| | | |
|---|---|---|
| JP | 2008-147514 | 6/2008 |
| JP | 2009-021309 A | 1/2009 |
| JP | 2010-519770 | 6/2010 |
| JP | 2012074684 A | 4/2012 |
| WO | WO2023/032193 A1 | 3/2023 |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 Dram Cell with Vertical Pillar Transistor(VPT)," 2011 Proceeding of the European Solid-State Device Research Conference, (2011) (4 pages).

H. S. Philip Wong, S. Raoux, S. Kim, Jiale Liang, J. R. Reifenberg, B. Rajendran, M. Asheghi and K. E. Goodson: "Phase Change Memory," Proceedings of IEEE, vol. 98, No. 12, December, pp. 2201-2227 (2010) (27 pages).

K. Tsunoda, K .Kinoshita, H. Noshiro, Y. Tamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007) (4 pages).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015) (9 pages).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (2010) (3 pages).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012) (3 pages).

T. Shino, M. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006). (4 pages).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697,Apr. 2006. (6 pages).

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., vol. E90-c., No. 4 pp. 765-771 (2007) (7 pages).

Takashi Ohasawa and Takeshi Hamamoto, "Floating Body Cell—a Novel Body Capacitorless DRAM Cell", Pan Stanford Publishingn (2011) (140 pages).

K. Sakui, N. Harada, "Dynamic Flash Memory with Dual Gate Surrounding Gate Transistor (SGT)," Proc. IEEE IMW, pp. 72-75(2021) (2 pages).

Yuan Taur and Tak. H. Ning, "Fundamentals of Modern VLSI Devices" (2021). (5 pages).

International Preliminary Report on Patentability in Japanese Application No. PCT/JP2023/020110, dated Feb. 6, 2024 (4 pages).

English Translation of International Preliminary Report on Patentability (PCT/IB/338 & PCT/IPEA/409) issued in PCT Application No. PCT/JP2023/020110, dated Dec. 4, 2025 (9 pages).

* cited by examiner

41

14

4

3

1

SEMICONDUCTOR MEMORY CELL HAVING TWO GATES AND ONE CHANNEL LAYER

CROSS-REFERENCE TO RELATED APPLICATIONS

This application claims priority to PCT/JP2023/020110, filed May 30, 2023, the entire content of which is incorporated herein by reference.

BACKGROUND OF THE INVENTION

Field of the Invention

The present invention relates to a memory device using a semiconductor element.

Description of the Related Art

In recent years, in LSI (Large Scale Integration) technology development, there have been demands for greater packaging density, higher performance, lower power consumption, and higher functionality of memory devices using semiconductor elements.

With a typical planar MOS transistor, a channel extends in a horizontal direction along a top surface of a semiconductor substrate. In contrast, a channel of an SGT extends in a direction perpendicular to a top surface of a semiconductor substrate (see, for example, Japanese Patent Laid-Open No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Consequently, the SGT enables greater packaging density of semiconductor devices than does the planar MOS transistor. The use of the SGT as a select transistor enables high integration of a DRAM (Dynamic Random Access Memory; see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)) connected with a capacitor, a PCM (Phase Change Memory; see, for example, H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)) connected with a variable resistance element, an RRAM (Resistive Random Access Memory; see, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3 V," IEDM (2007)), and an MRAM (Magneto-resistive Random Access Memory; see, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)) that varies resistance by changing an orientation of a magnetic spin using a current.

There is also a capacitorless DRAM memory cell made up of a single MOS transistor (see M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010); J. Wan, L. Rojer, A.

Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012); Takashi Ohasawa and Takeshi Hamamoto, "Floating Body Cell—a Novel Body Capacitorless DRAM Cell", Pan Stanford Publishing (2011); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006); and E. Yoshida: "A Capacitorless 1T-DRAM Technology Using Gate-Induced Drain-Leakage (GIDL) Current for Low-Power and High-Speed Embedded Memory," IEEE IEDM (2006)). For example, out of positive hole groups and electron groups generated in a channel by impact ionization phenomenon using a source-drain current of an n-channel MOS transistor, with some or all of the positive hole groups being held in the channel, logical storage data of "1" is written. Then the positive hole groups are removed from the channel and logical storage data of "0" is written. Challenges for the memory cell are to correct reductions in an operating margin caused by fluctuations in a floating body channel voltage and correct reductions in data retention characteristics through removal of some positive hole groups, which are a signal charge accumulated in the channel.

There is also a twin-transistor MOS transistor memory element obtained by forming one memory cell on an SOI layer using two MOS transistors (see, for example, US2008/0137394 A1, US2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI, "IEICE Trans. Electron., Vol. E90-c., No. 4 pp. 765-771 (2007)). Furthermore, there is also a capacitorless dynamic flash memory (DFM), which is a memory cell made up of two gate electrodes (see K. Sakui, N. Harada, "Dynamic Flash Memory with Dual Gate Surrounding Gate Transistor (SGT)," Proc. IEEE IMW, pp. 72-75 (2021)). The memory cell is caused to perform memory operation by manipulating voltages of four electrodes, thereby varying carrier concentration in a floating body, and thereby creating a conducting or non-conducting state. A structure has also been proposed in which a body for use to accumulate carriers is connected to a lower part of a MOS transistor (see US 2023/0077140 A1), and there have been demands for greater packaging density and higher performance of the memory. The present application relates to a memory device using a semiconductor element that can be made up solely of a MOS transistor without a variable resistance element or a capacitor.

SUMMARY OF THE INVENTION

An object of the present invention is to increase accuracy and packaging density and reduce cost of a MOS transistor that writes and reads data and of a memory element that has a MOS structure connected to a substrate of the MOS transistor and that accumulates signal charges that represent memory data of "1" and "0".

To solve the above problem, according to a first aspect of the present application, there is provided a memory device using a semiconductor element, the memory device comprising: a first semiconductor region; a first impurity region placed on the first semiconductor region; a second semiconductor region extending in a vertical direction by being placed in contact with the first impurity region, with a surface of the second semiconductor region being concave in vertical section; a first gate insulating layer covering part of the second semiconductor region; a first gate conductor layer placed in contact with the first gate insulating layer; a second gate insulating layer formed along at least a recess in the second semiconductor region and provided with a concave-shaped vertical section; a second gate conductor layer formed inside a recess in the second gate insulating layer; and a second impurity region and a third impurity region each formed in contact with a top surface of a protrusion in the recess in the second semiconductor region; wherein a top surface of the second gate conductor layer is located at a lower position than a top surfaces of the second impurity region and the third impurity region.

According to a second aspect, in the first aspect, the second impurity region and the third impurity region are in contact with the second gate insulating layer.

According to a third aspect, in the first aspect, one or both of a contact surface between the second semiconductor region and the second impurity region and a contact surface between the second semiconductor region and the third impurity region are located at a higher position than a bottom of the second gate insulating layer.

According to a fourth aspect, in the first aspect, there is a part in which only an insulating layer exists in a horizontal direction between the second impurity region and the third impurity region.

According to a fifth aspect, in the first aspect, a minimum distance between the second impurity region and the third impurity region is larger than a horizontal length of a vertical section of the second gate conductor layer.

According to a sixth aspect, in the first aspect, majority carriers in the first impurity region are different from majority carriers in the first semiconductor region.

According to a seventh aspect, in the first aspect, majority carriers in the second semiconductor region are same as majority carriers in the first semiconductor region.

According to an eighth aspect, in the first aspect, majority carriers in the second impurity region and the third impurity region are same as majority carriers in the first impurity region.

According to a ninth aspect, in the first aspect, the first impurity region is shared by a plurality of adjacent memory cells.

According to a tenth aspect, in the first aspect, the second impurity region or the third impurity region is shared by a plurality of adjacent memory cells.

According to an eleventh aspect, in the first aspect, a top surface of the first impurity region is located at a higher position than an undersurface of the first gate insulating layer in the vertical direction.

According to a twelfth aspect, in the first aspect, undersurfaces of the second impurity region and the third impurity region are located at a higher position than a top surface of the first gate insulating layer in the vertical direction.

According to a thirteenth aspect, in the first aspect, a threshold of a MOS transistor made up of the second semiconductor region, the second impurity region, the third impurity region, the second gate insulating layer, and the second gate conductor layer is varied by changing a voltage applied to the first gate conductor layer.

According to a fourteenth aspect, the first aspect further comprises: a first interconnecting conductor layer connected to the second impurity region; a second interconnecting conductor layer connected to the third impurity region; a third interconnecting conductor layer connected to the second gate conductor layer; a fourth interconnecting conductor layer connected to the first gate conductor layer; and a fifth interconnecting conductor layer connected to the first impurity region, wherein a memory write operation is performed by controlling voltages applied to the first interconnecting conductor layer, the second interconnecting conductor layer, the third interconnecting conductor layer, the fourth interconnecting conductor layer, and the fifth interconnecting conductor layer and performing an operation of generating electron groups and positive hole groups in the second semiconductor region, by an impact ionization phenomenon or a gate induced drain leakage current using a current passed between the second impurity region and the third impurity region, an operation of removing minority carriers in the second semiconductor region among the generated electron groups and the positive hole groups, and an operation of causing part or all of majority carriers in the second semiconductor region to remain in the second semiconductor region, and a memory erase operation is performed by controlling voltages applied to the first interconnecting conductor layer, the second interconnecting conductor layer, the third interconnecting conductor layer, the fourth interconnecting conductor layer, and the fifth interconnecting conductor layer and extracting majority carriers remaining in the second semiconductor region from at least one of the first impurity region, the second impurity region, and the third impurity region by recombining the majority carriers with majority carriers in the first impurity region, the second impurity region, and the third impurity region.

According to a fifteenth aspect, in the fourteenth aspect, the first interconnecting conductor layer connected to the second impurity region is a source line, the second interconnecting conductor layer connected to the third impurity region is a bit line, the third interconnecting conductor layer connected to the second gate conductor layer is a word line, the fourth interconnecting conductor layer connected to the first gate conductor layer is a plate line, the fifth interconnecting conductor layer is a control line, and the memory write operation and the memory erase operation are performed by applying voltages to the source line, the bit line, the plate line, the word line, and the control line.

5

Figure 4A:
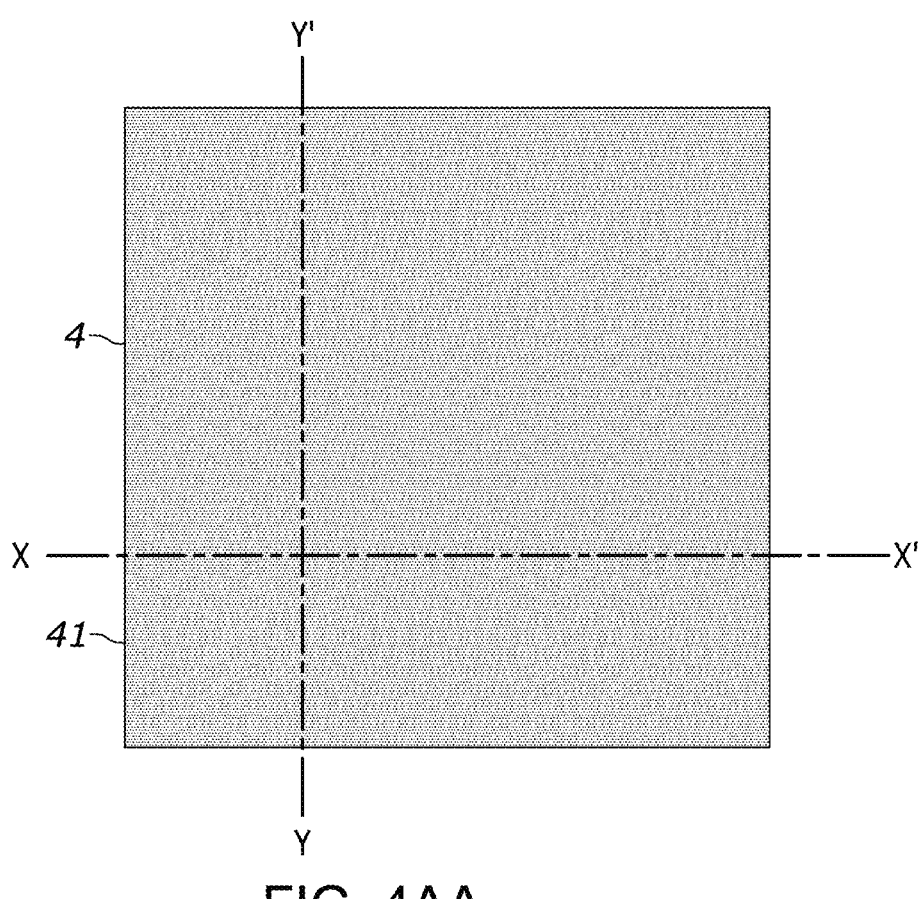
FIGS. 4AA, 4AB and 4AC are diagrams for explaining a method for manufacturing a memory device according to a second embodiment.
Figure 4A:
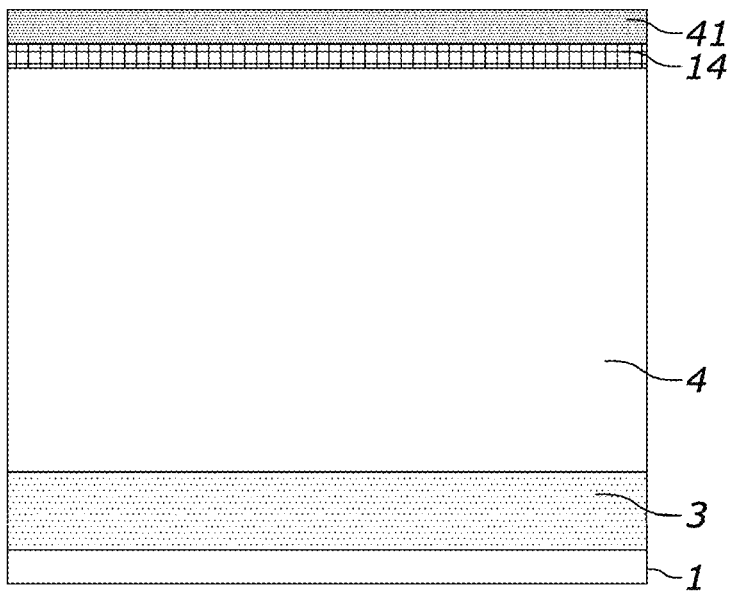
Figure 4A:
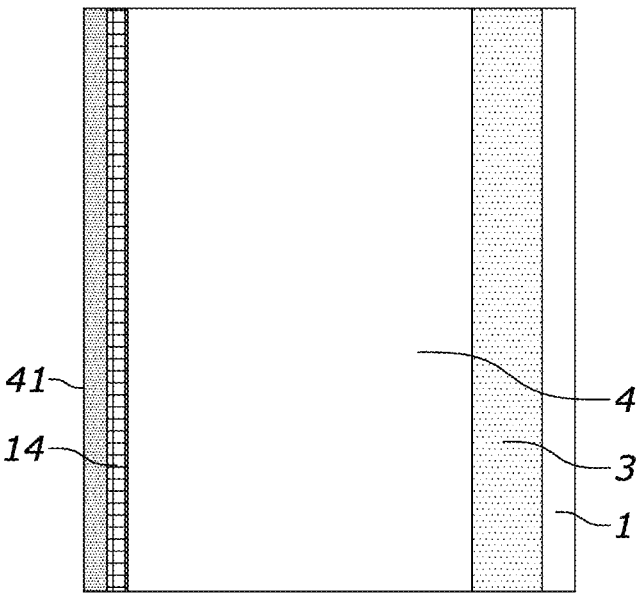
Figure 4B:
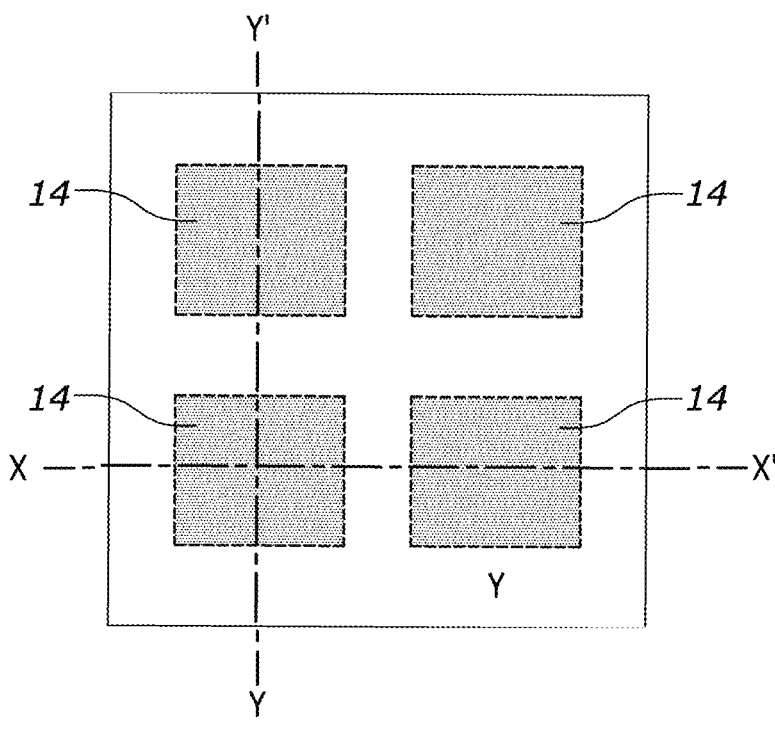
FIGS. 4BA, 4BB and 4BC are diagrams for explaining a method for manufacturing the memory device according to the second embodiment.
Figure 4B:
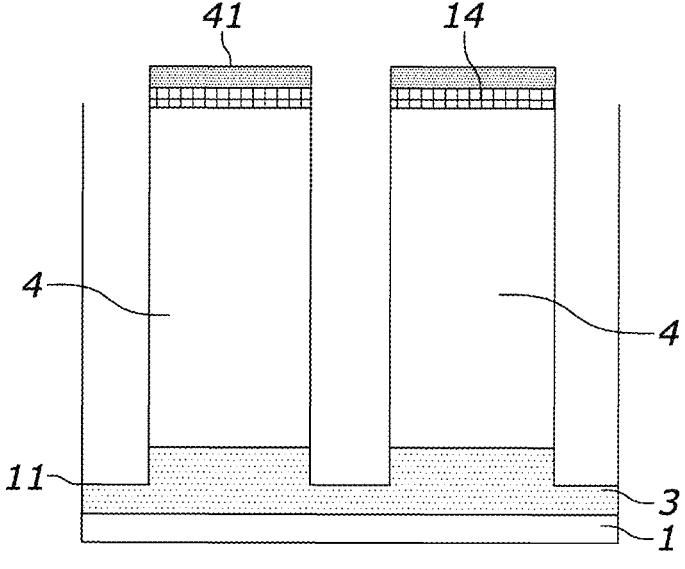
Figure 4B:
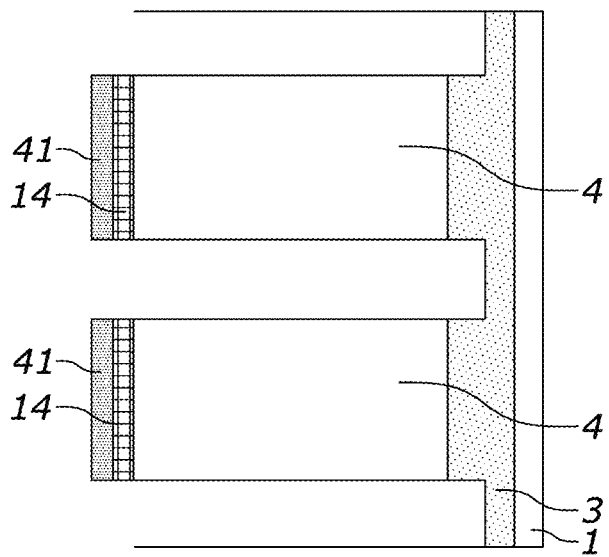
Figure 4C:
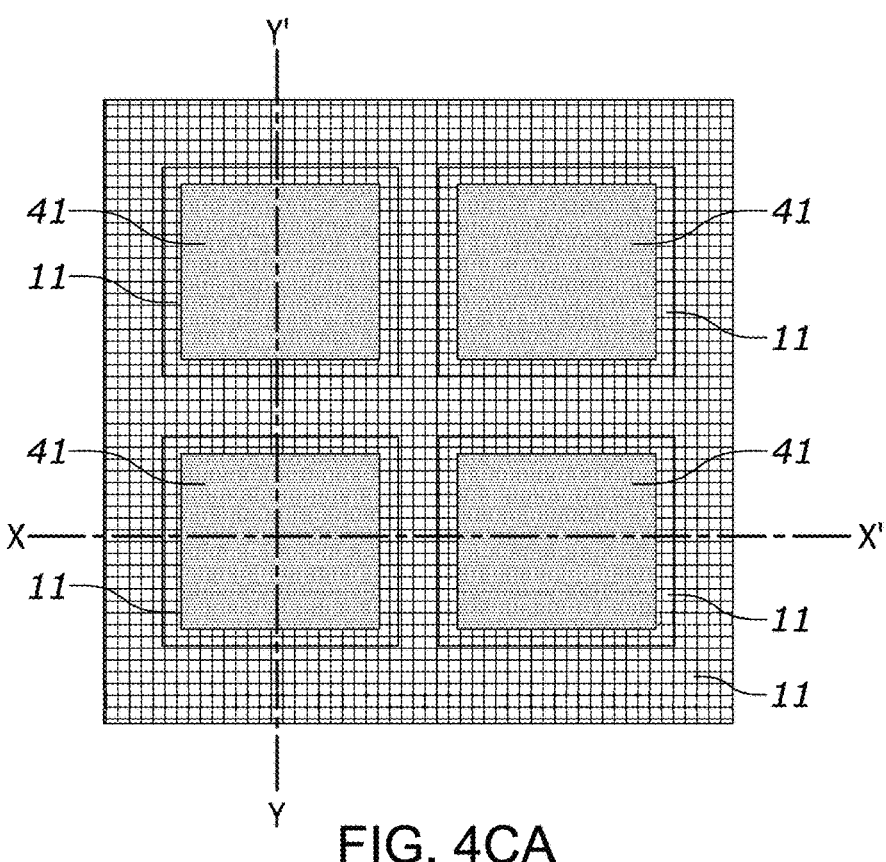
FIGS. 4CA, 4CB and 4CC are diagrams for explaining a method for manufacturing the memory device according to the second embodiment.
Figure 4C:
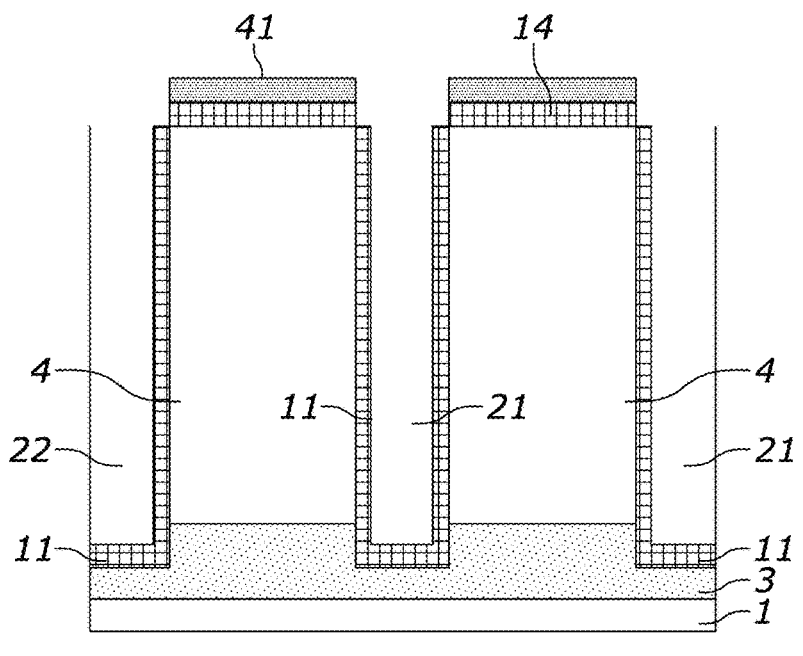
Figure 4C:
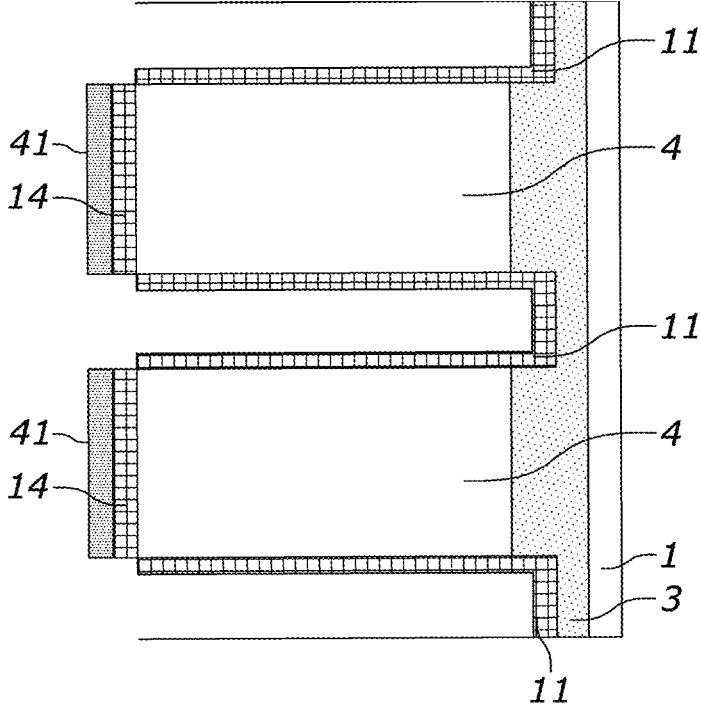
Figure 4D:
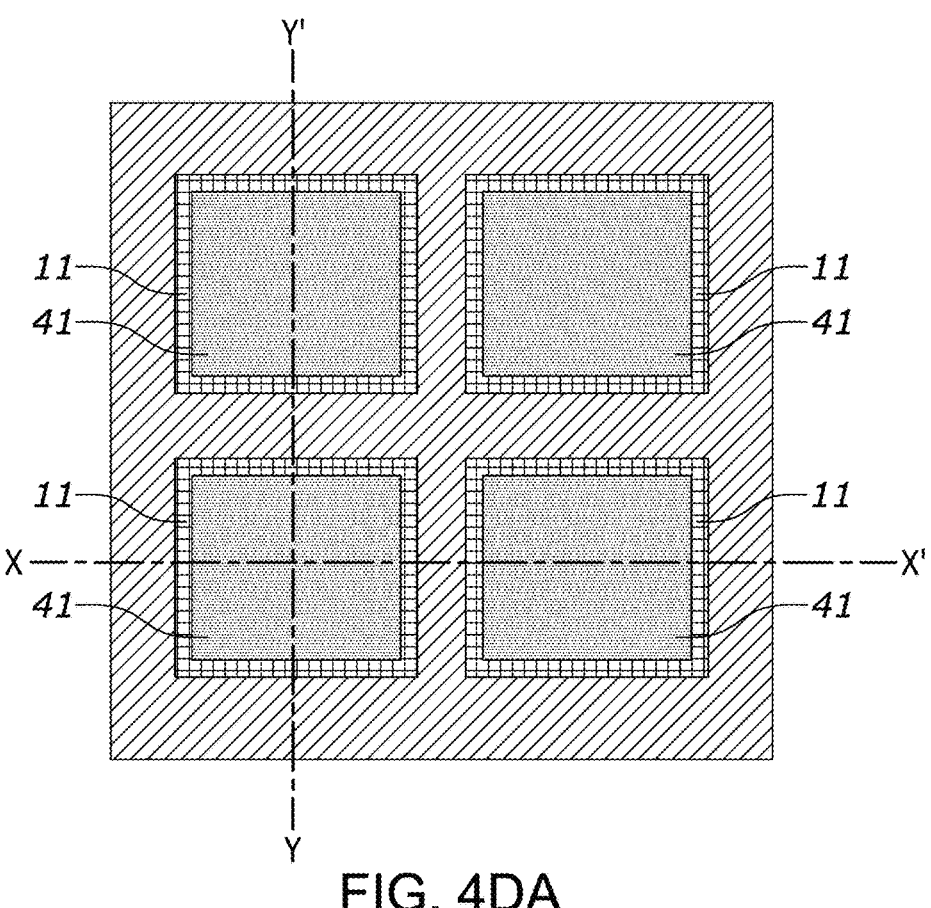
FIGS. 4DA, 4DB and 4DC are diagrams for explaining a method for manufacturing the memory device according to the second embodiment.
Figure 4D:
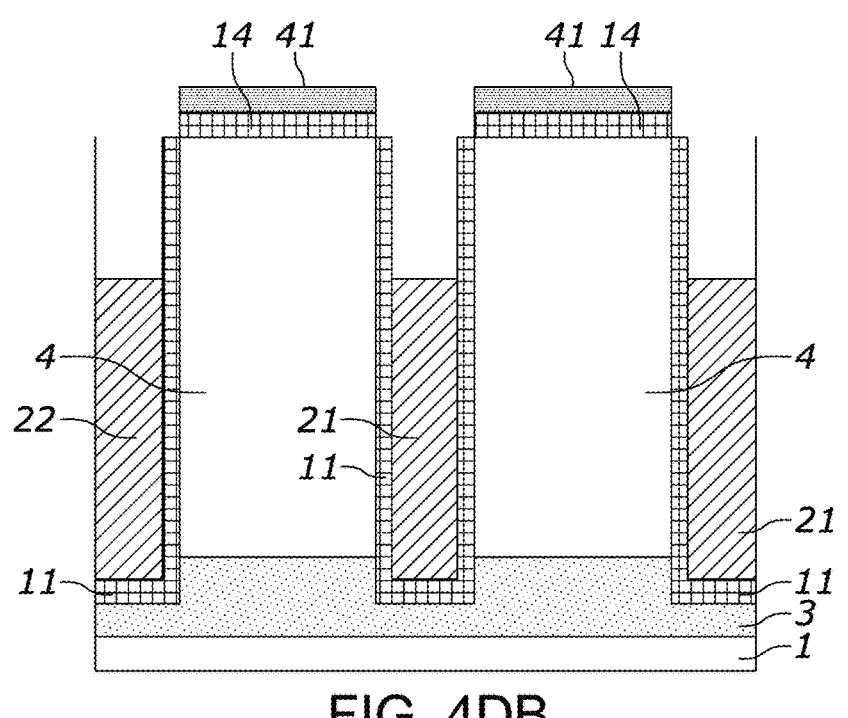
Figure 4D:
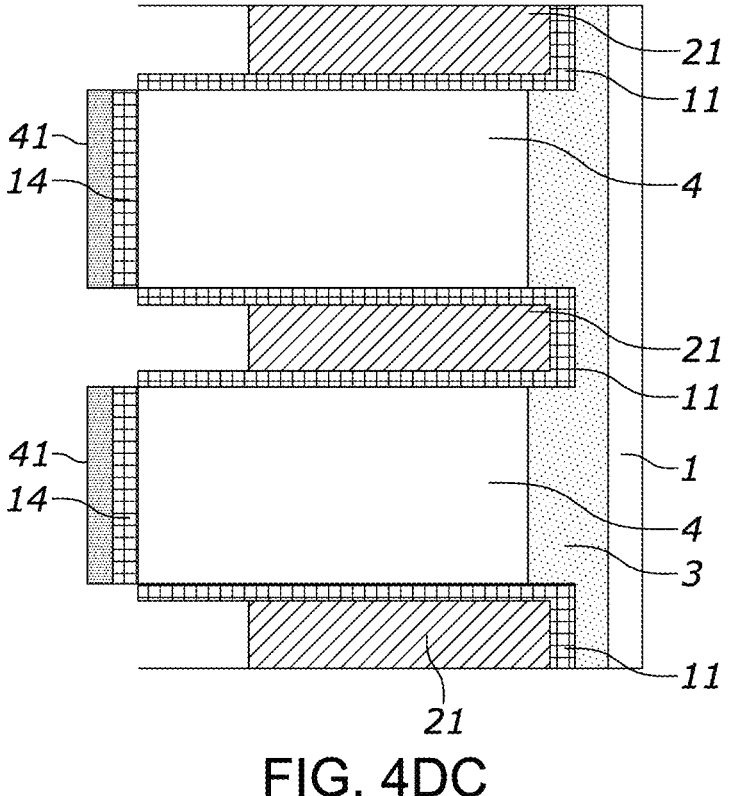
Figure 4E:
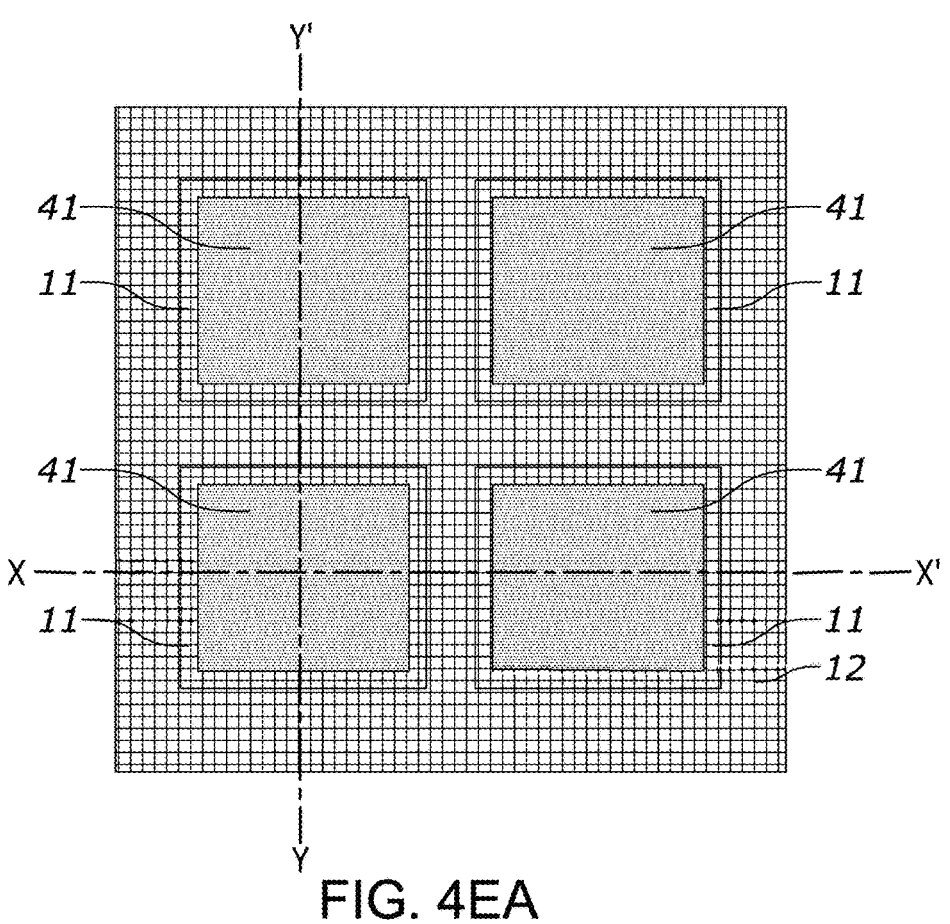
Figure 4E:
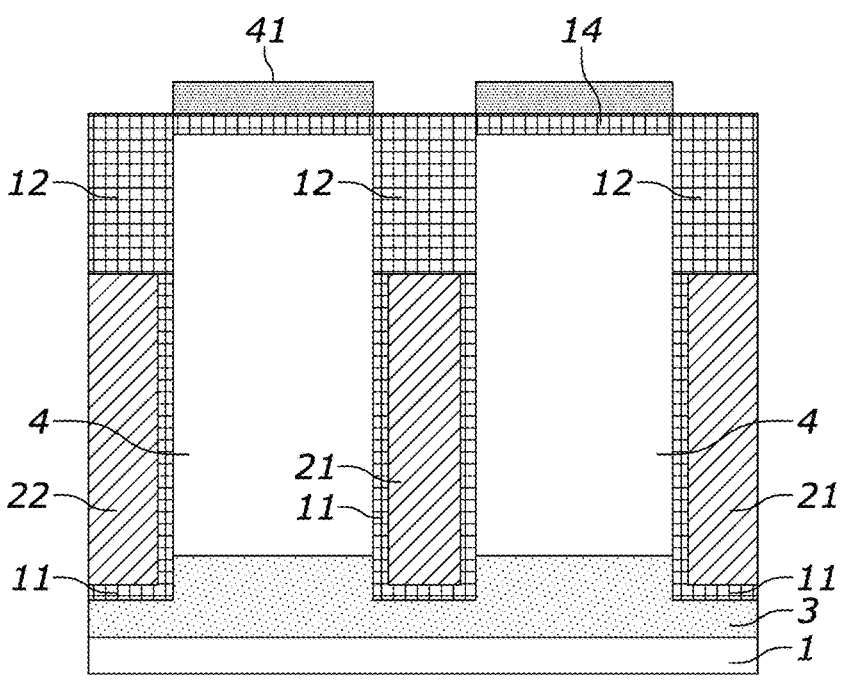
Figure 4E:
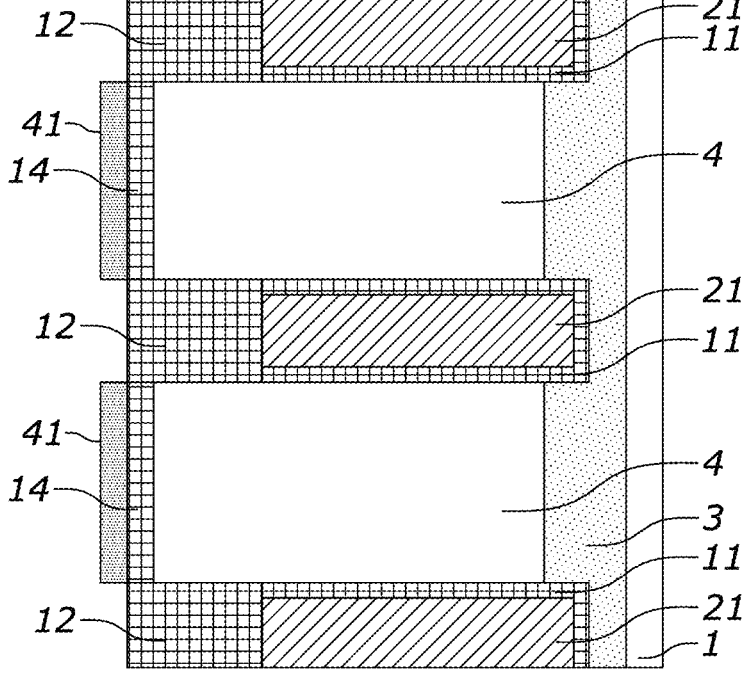
Figure 4F:
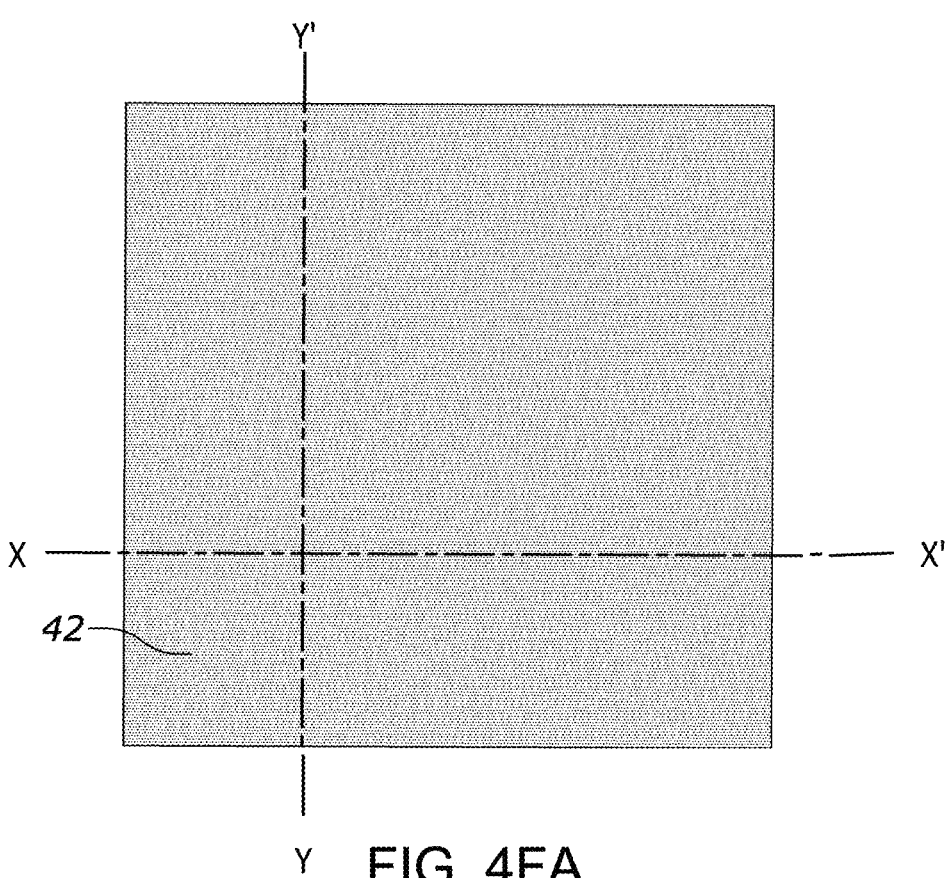
Figure 4F:
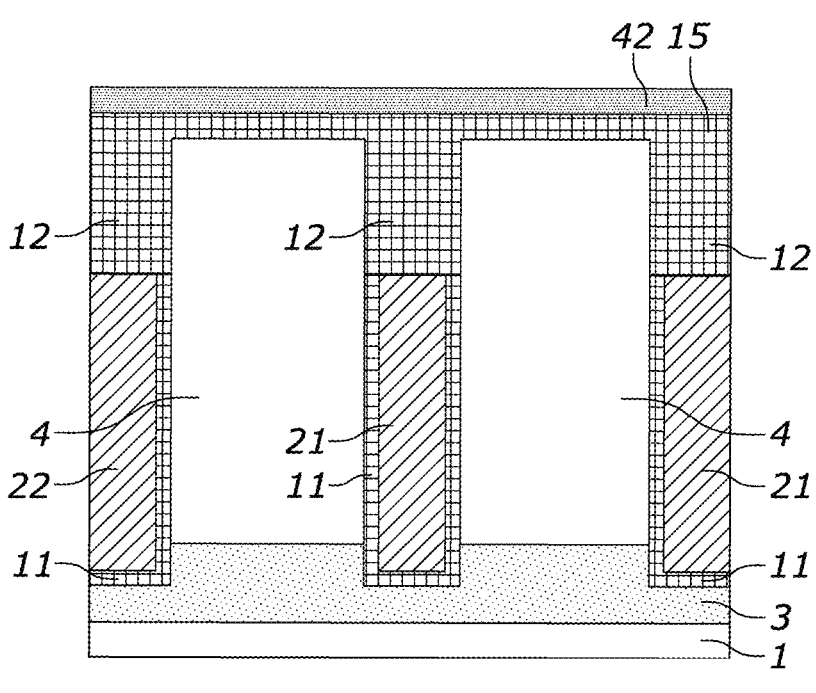
Figure 4F:
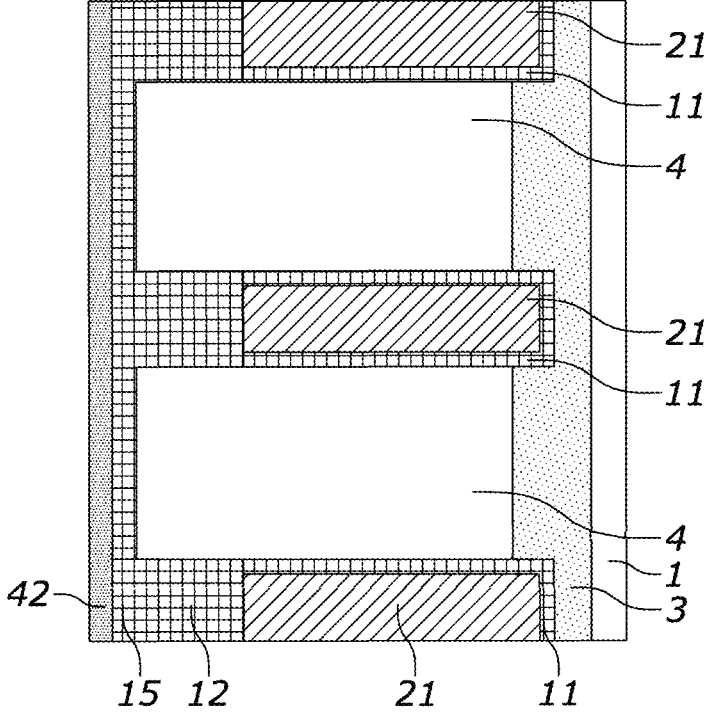
Figure 4G:
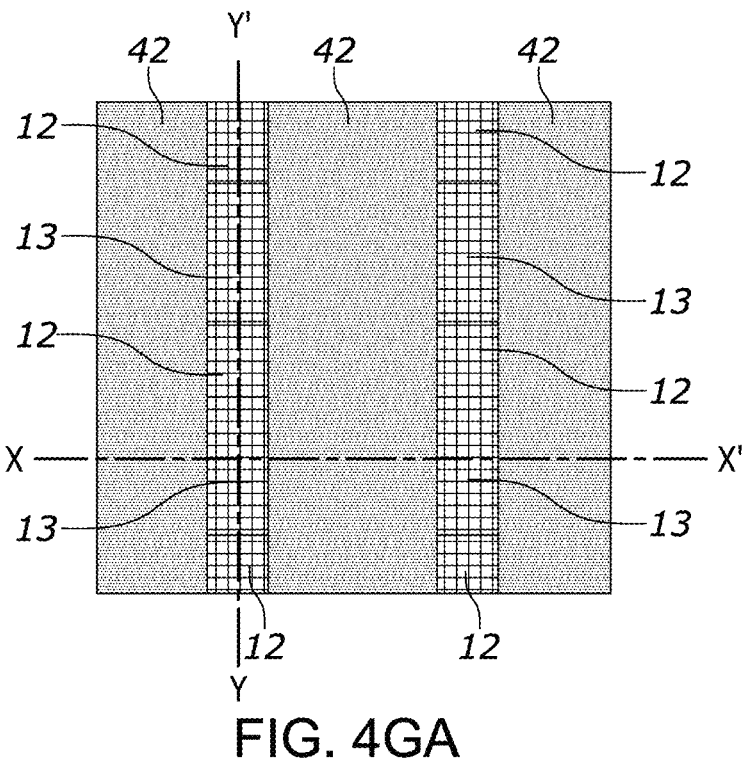
Figure 4G:
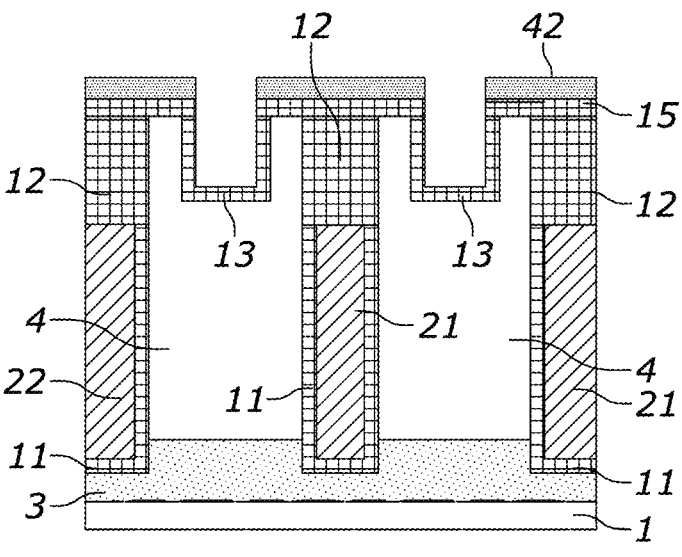
Figure 4G:
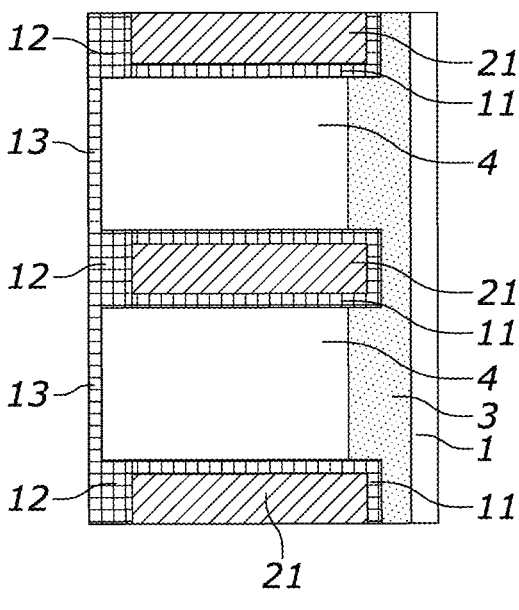
Figure 4H:
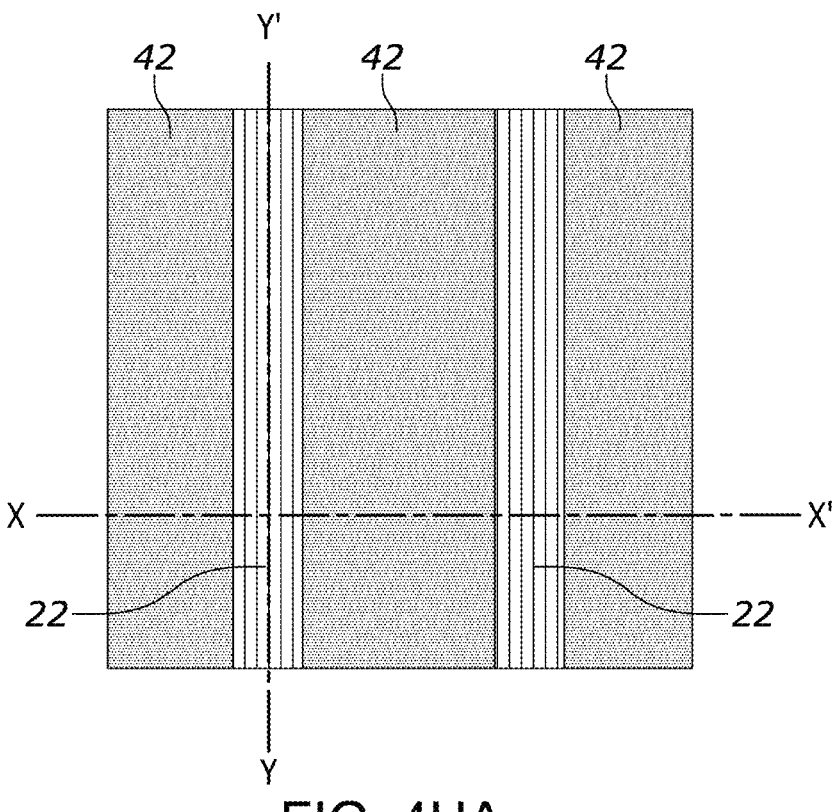
Figure 4H:
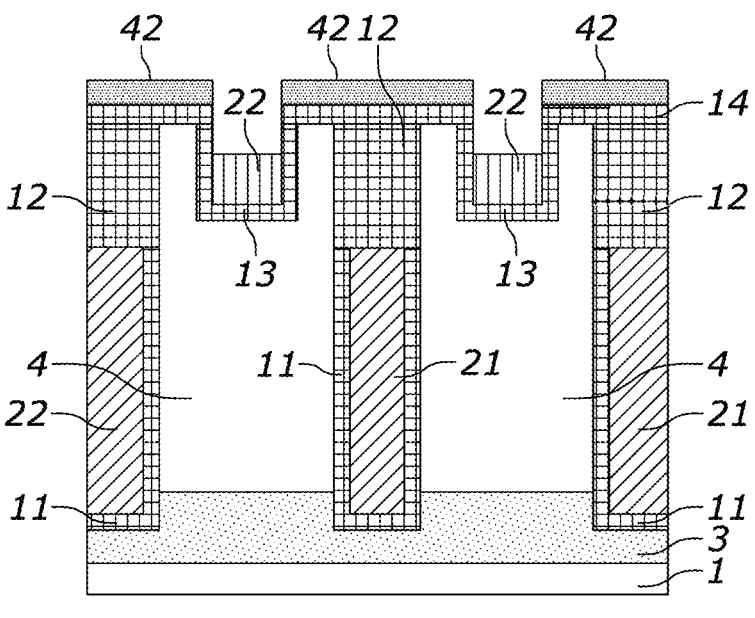
Figure 4H:
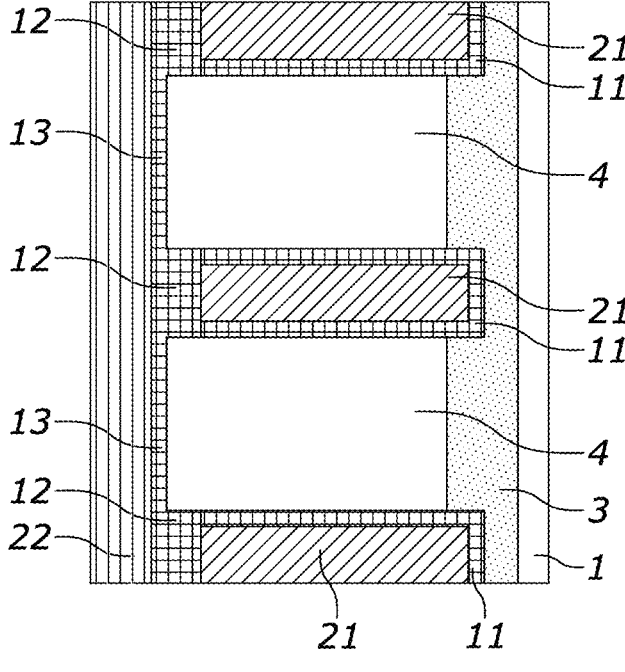
Figure 4I:
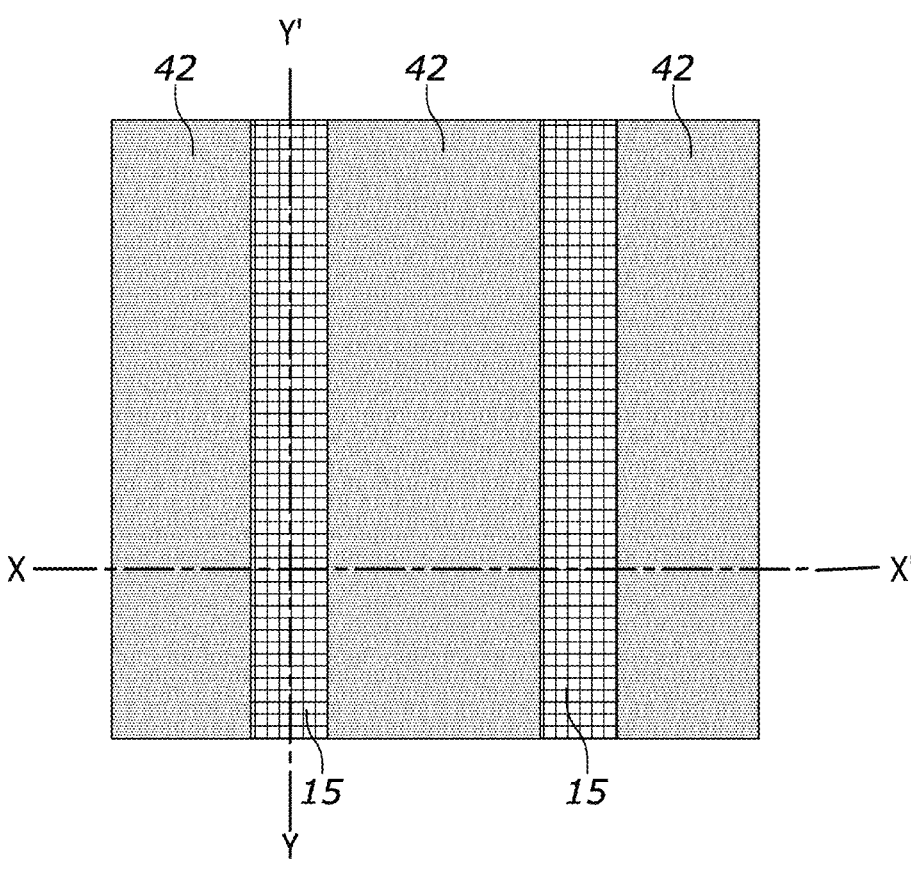
Figure 4I:
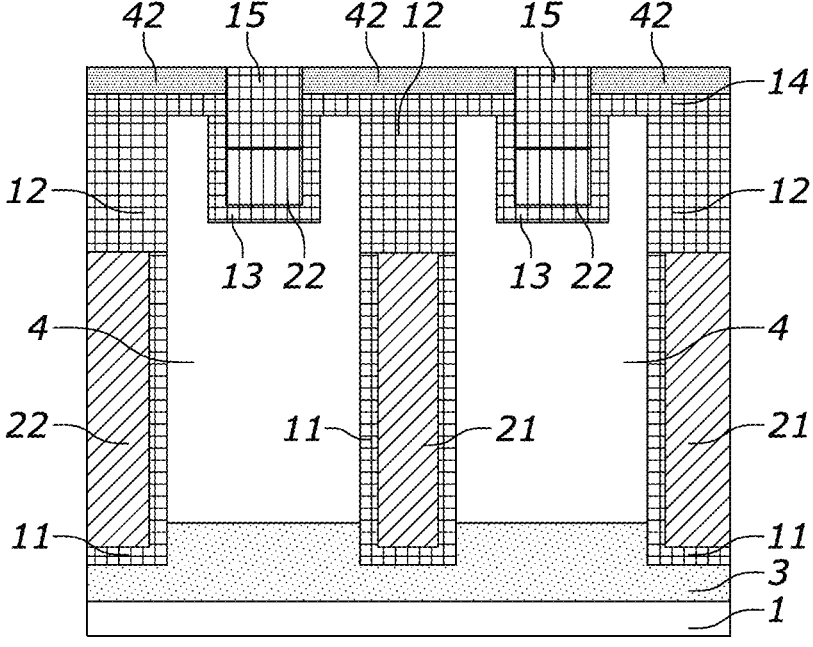
Figure 4I:
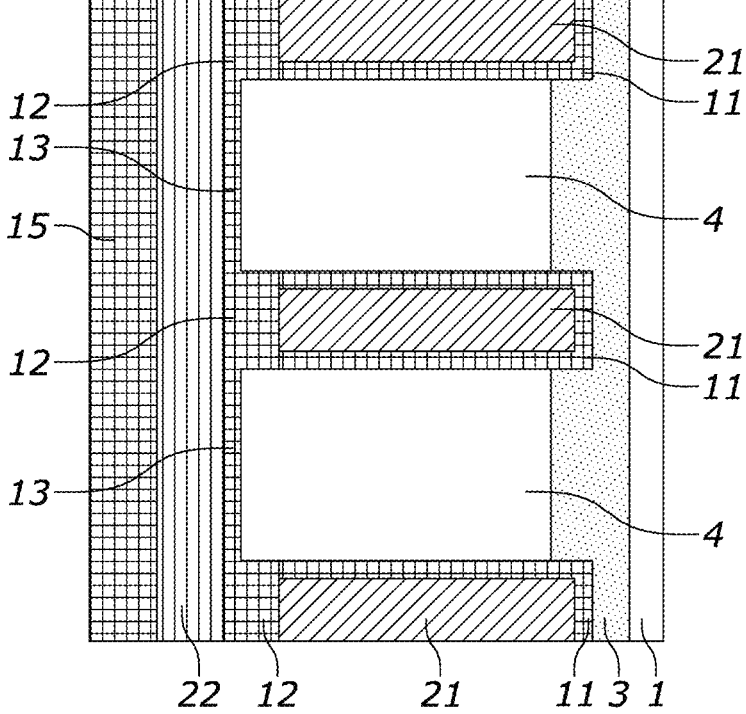
Figure 4J:
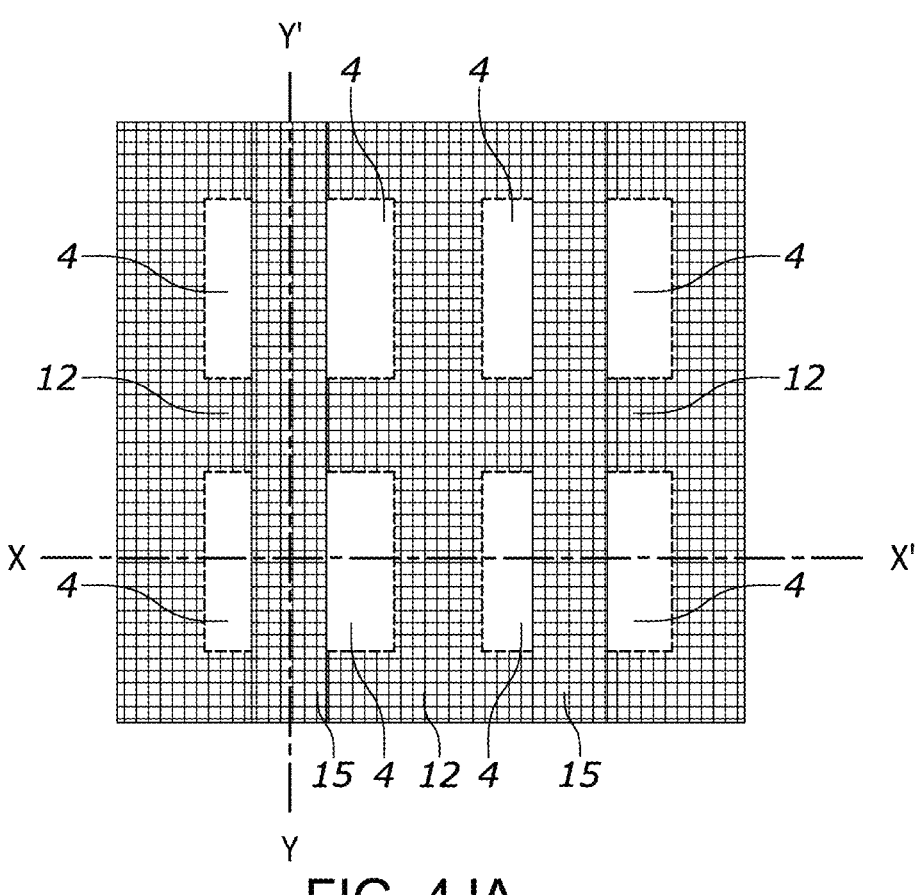
Figure 4J:
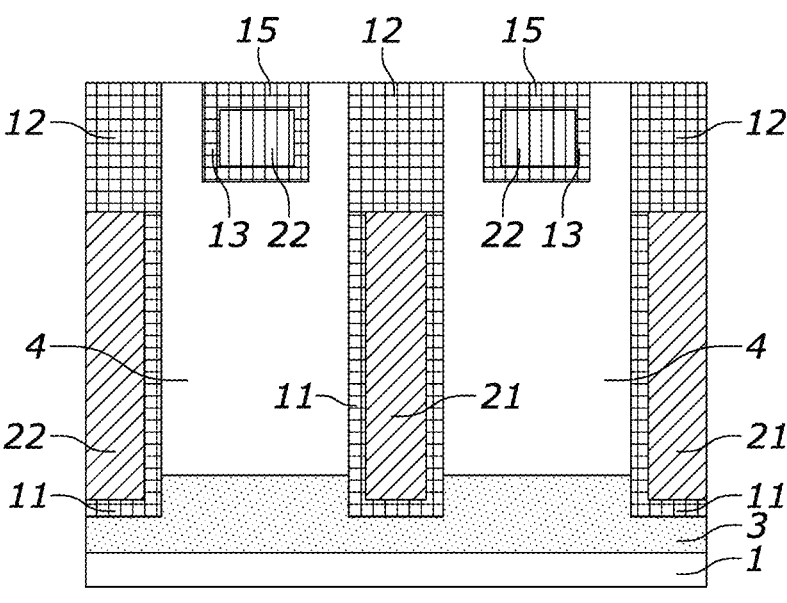
Figure 4J:
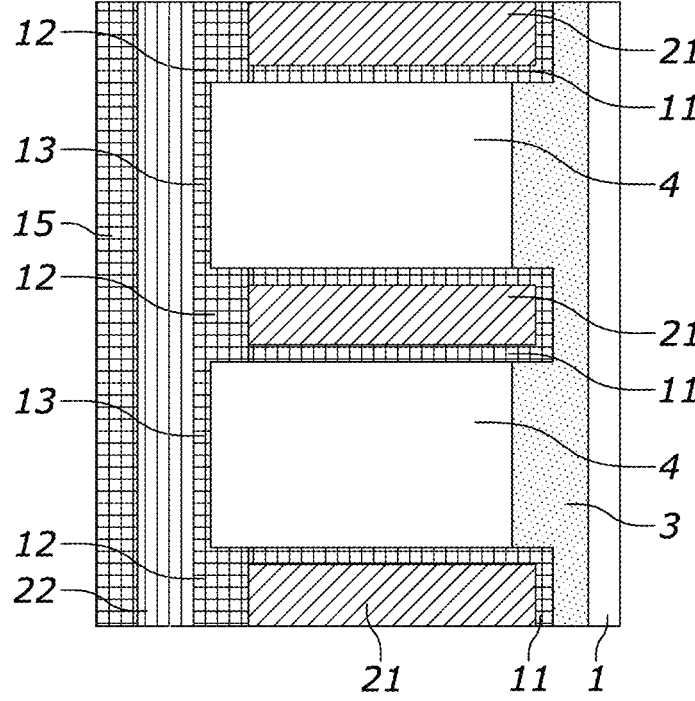
Figure 4K:
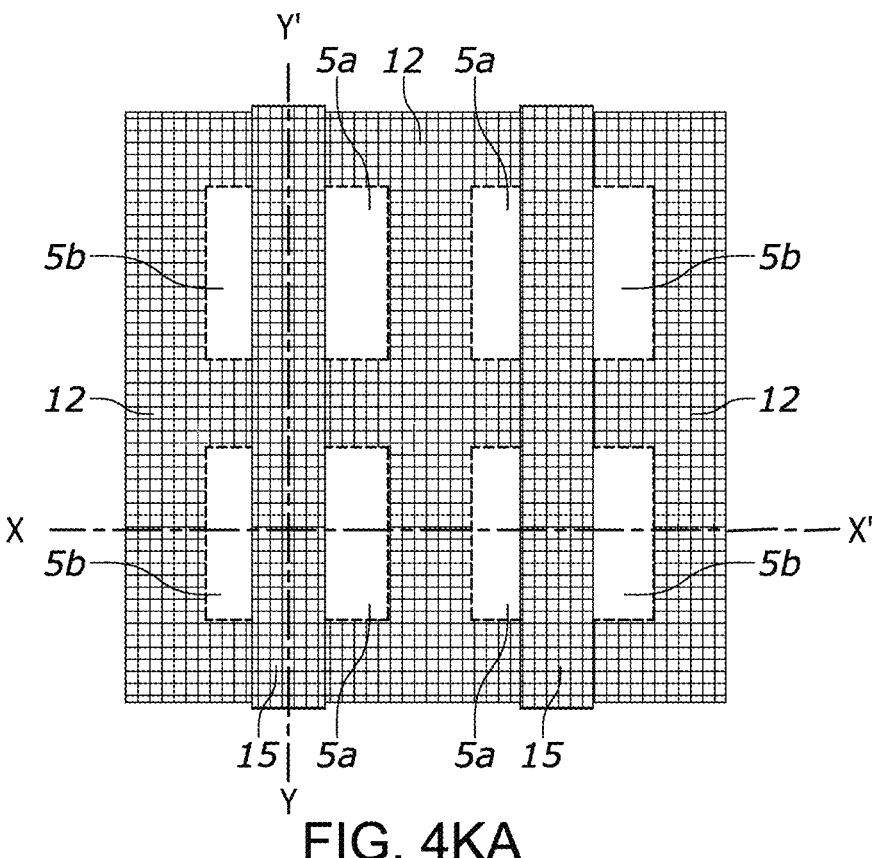
Figure 4K:
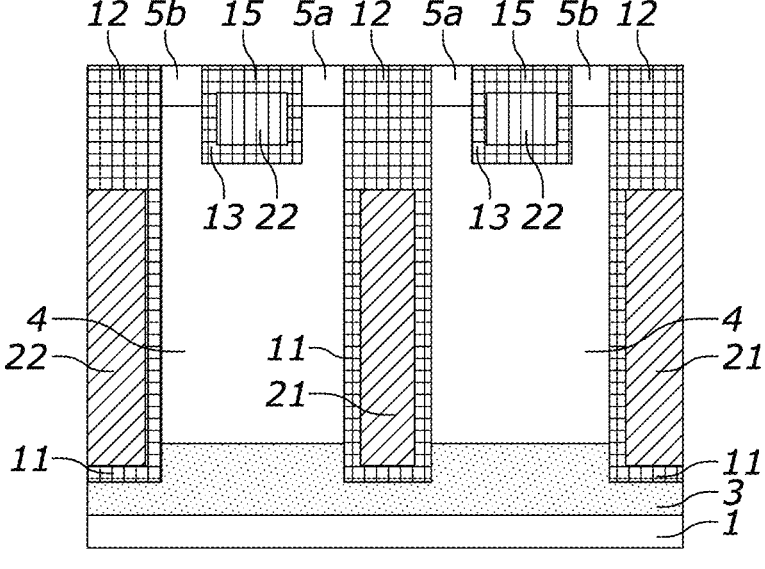
Figure 4K:
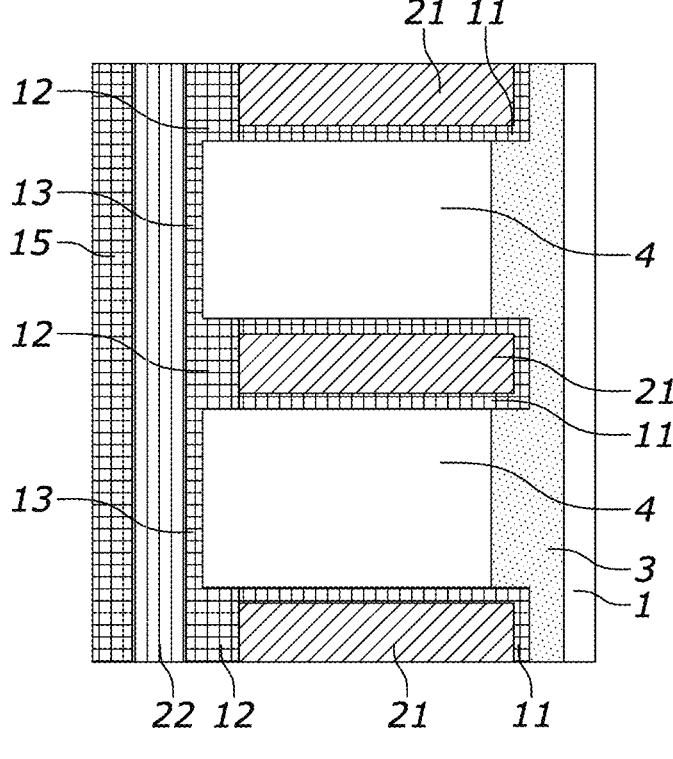
Figure 4L:
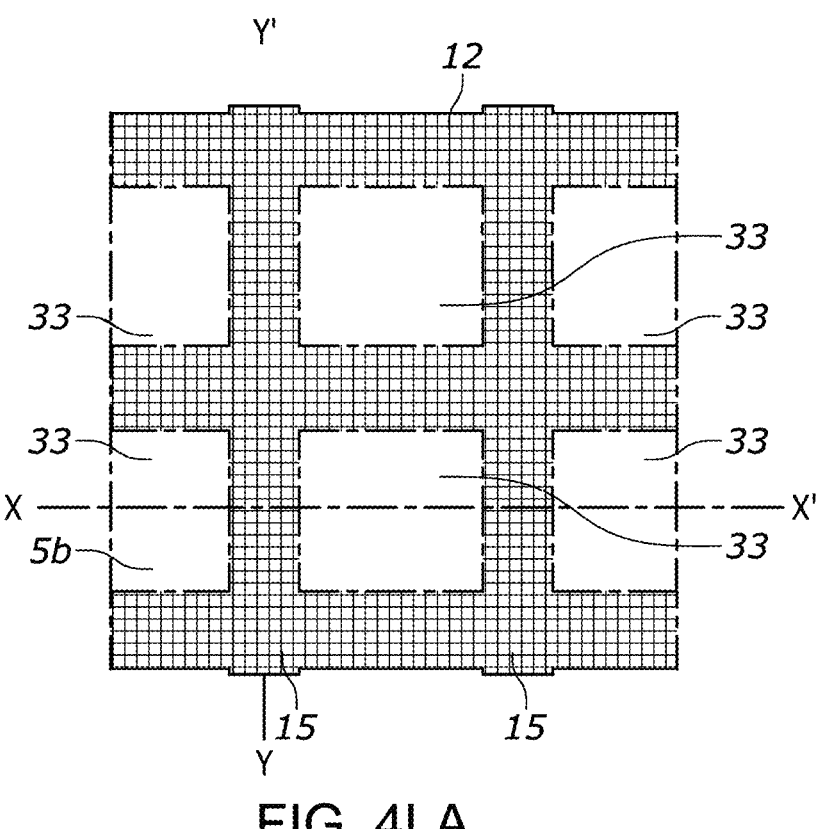
Figure 4L:
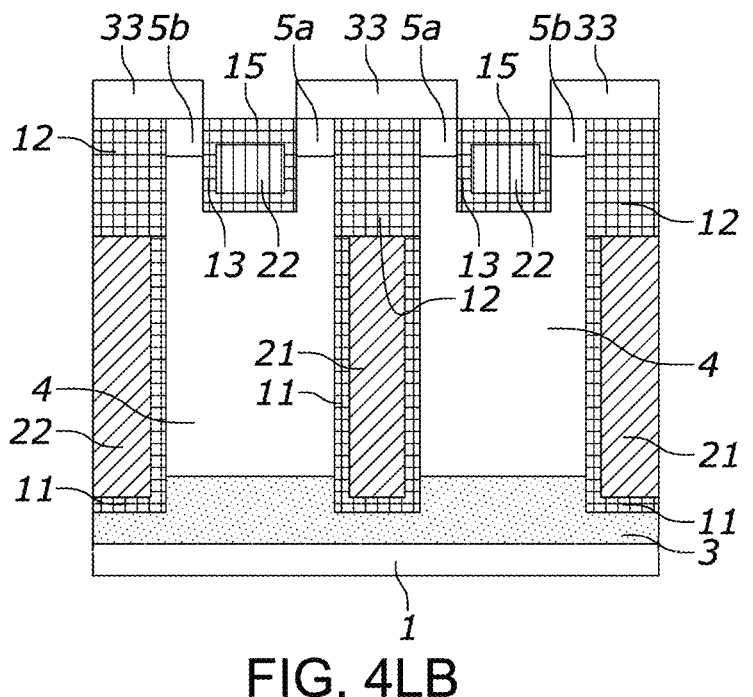
Figure 4L:
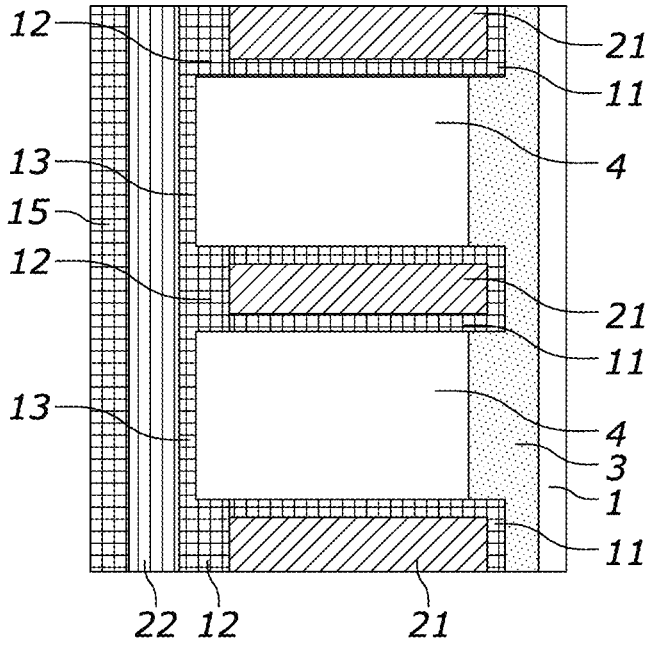
Figure 4M:
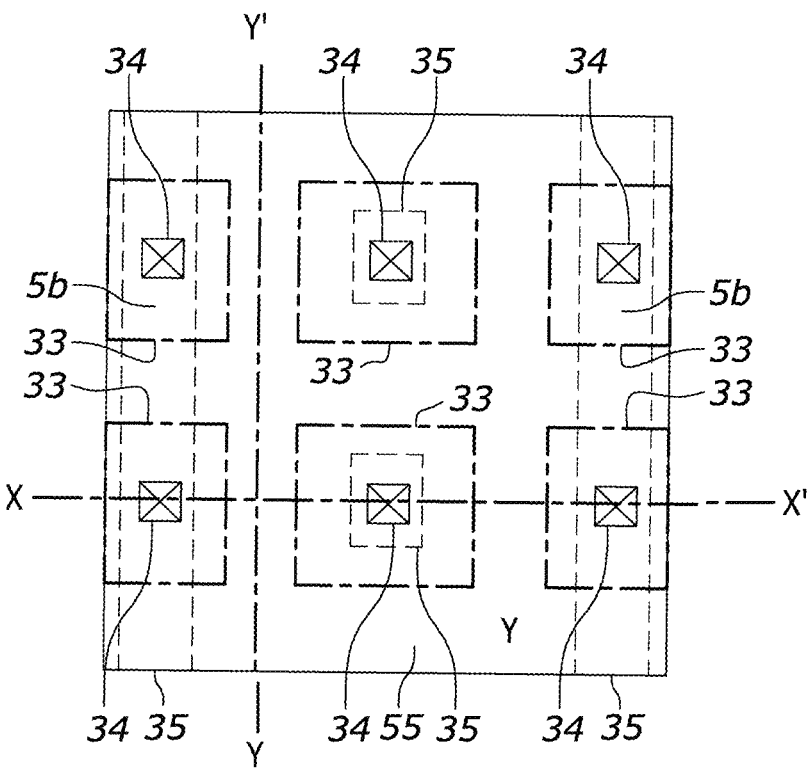
Figure 4M:
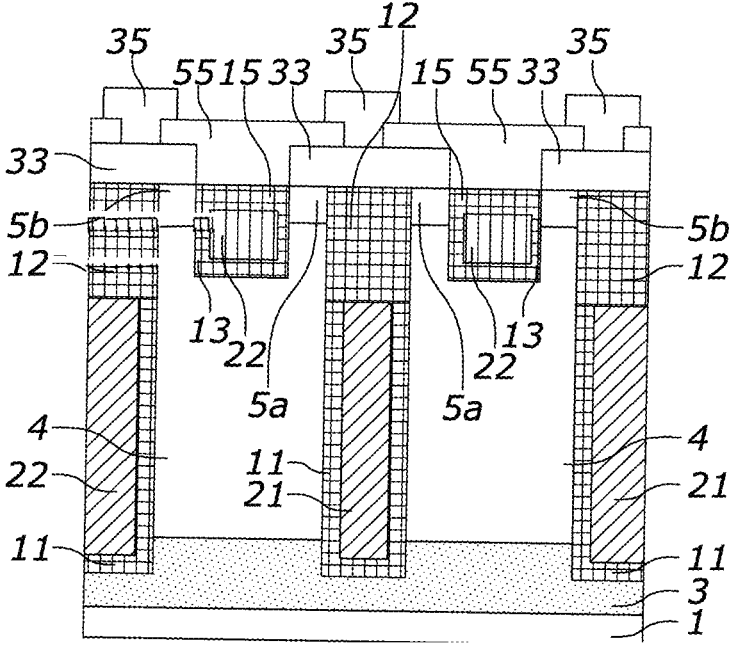
Figure 4M:
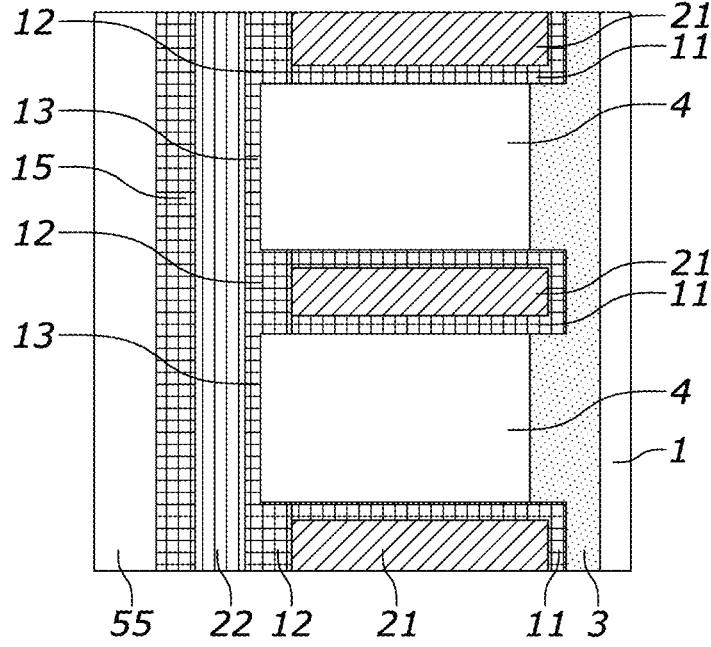
Figure 4N:
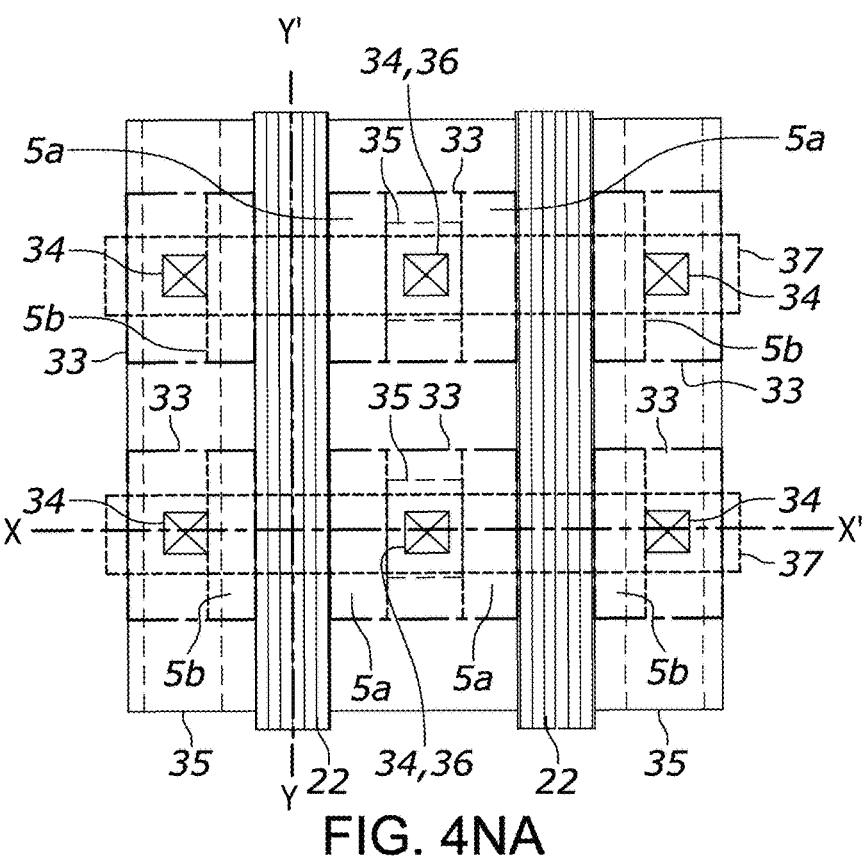
Figure 4N:
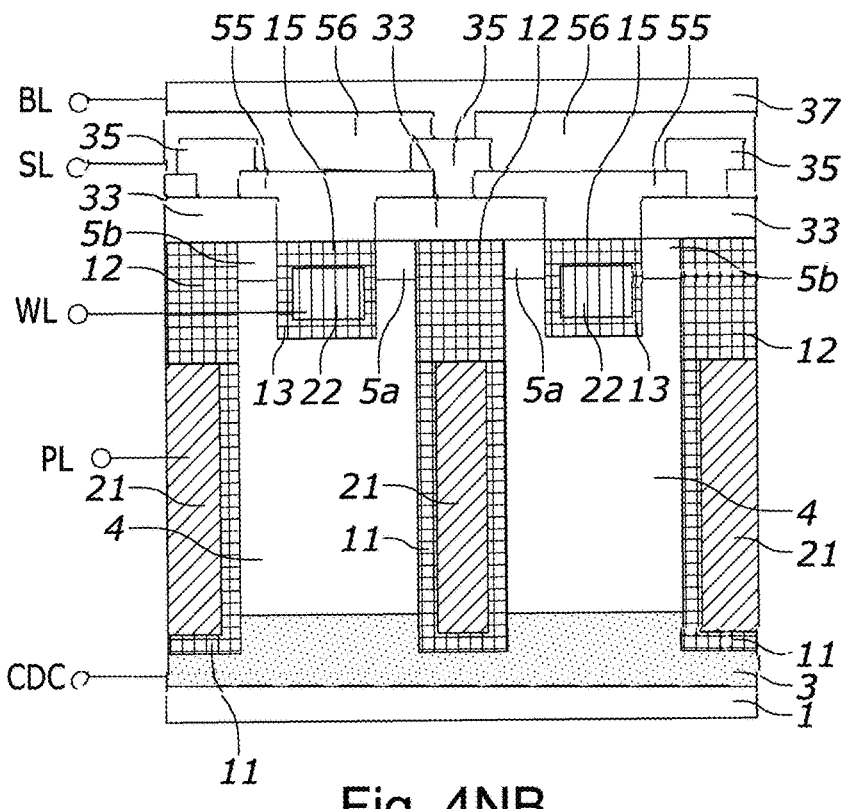
Figure 4N:
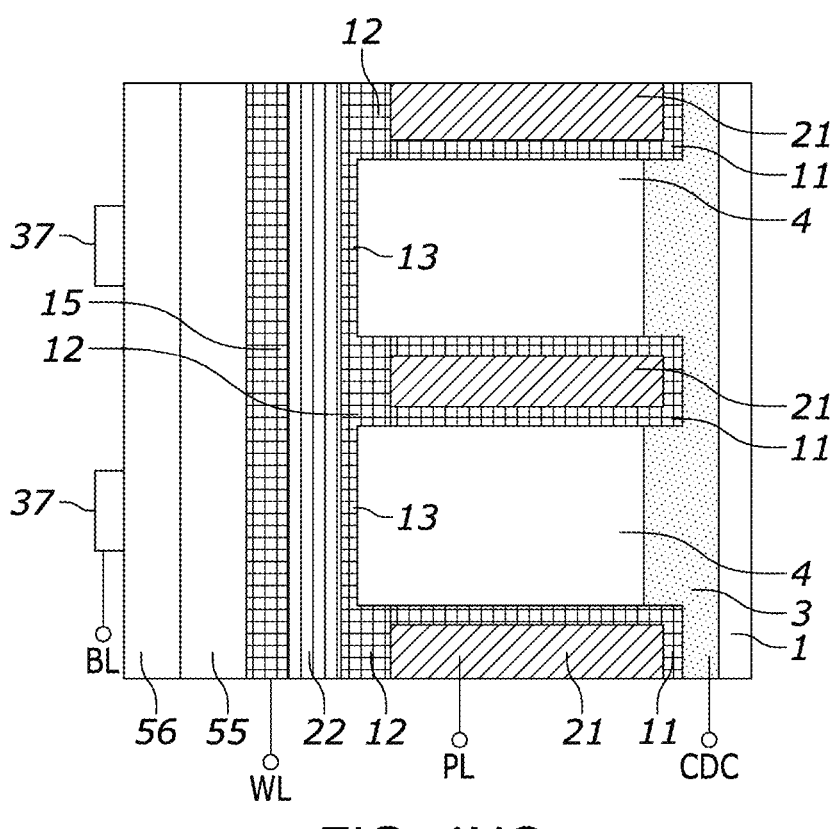

FIGS. 4EA, 4EB and 4EC are diagrams for explaining a method for manufacturing the memory device according to the second embodiment;

FIGS. 4FA, 4FB and 4FC are diagrams for explaining a method for manufacturing the memory device according to the second embodiment;

FIGS. 4GA, 4GB and 4GC are diagrams for explaining a method for manufacturing the memory device according to the second embodiment;

FIGS. 4HA, 4HB and 4HC are diagrams for explaining a method for manufacturing the memory device according to the second embodiment;

FIGS. 4IA, 4IB and 4IC are diagrams for explaining a method for manufacturing the memory device according to the second embodiment;

FIGS. 4JA, 4JB and 4JC are diagrams for explaining a method for manufacturing the memory device according to the second embodiment;

FIGS. 4KA, 4KB and 4KC are diagrams for explaining a method for manufacturing the memory device according to the second embodiment;

FIGS. 4LA, 4LB and 4LC are diagrams for explaining a method for manufacturing the memory device according to the second embodiment;

FIGS. 4MA, 4MB and 4MC are diagrams for explaining a method for manufacturing the memory device according to the second embodiment; and FIGS. 4NA, 4NB and 4NC are diagrams for explaining a method for manufacturing the memory device according to the second embodiment.

DETAILED DESCRIPTION OF THE PREFERRED EMBODIMENTS

A structure, a drive system, and accumulated-carriers' behavior of a memory device according to embodiments of the present invention will be described below with reference to the drawings, where the memory device uses a semiconductor element.

First Embodiment

A cell structure and operation of a memory according to a first embodiment of the present invention will be described using FIGS. 1 to 3, where the memory uses a semiconductor element. The cell structure of the memory using a semiconductor element according to the first embodiment of the present invention will be described using FIG. 1. A write mechanism and carrier behavior of the memory cell will be described using FIG. 2. An erase mechanism and carrier behavior of the memory cell will be described using FIG. 3.

Figure 1:
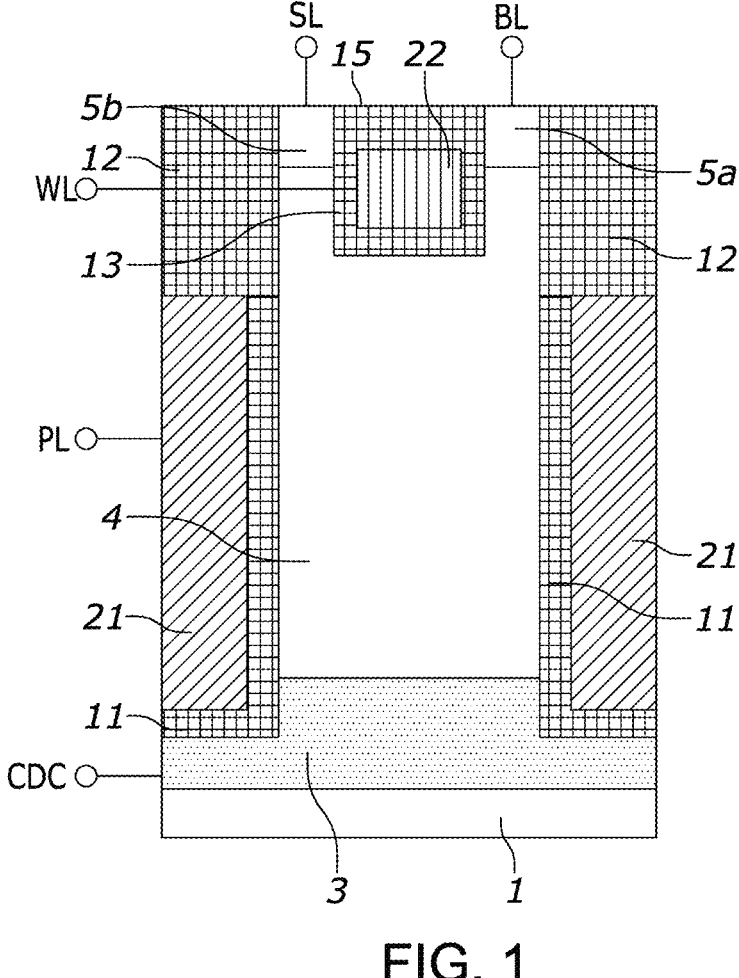
FIG. 1 is a diagram showing a sectional structure of a memory device according to a first embodiment, the memory device using a semiconductor element.

A vertical sectional structure of the memory device according to the first embodiment of the present invention is shown in FIG. 1, where the memory device uses a semiconductor element. There is a silicon p-layer 1 (which is an example of a "first semiconductor region" described in Claims) containing acceptor impurities and having a p conductivity type. An n-layer 3 (which is an example of a "first impurity region" described in Claims) containing donor impurities is placed in contact with the p-layer 1. A p-layer 4 (which is an example of a "second semiconductor region" described in Claims), which contains acceptor impurities and has a columnar shape, a rectangular horizontal section, and a concave-shaped top surface is placed in contact with part of the n-layer 3. Part of the p-layer 1, n-layer 3, and p-layer 4 is covered with a first gate insulating layer 11 (which is an example of a "first gate insulating layer" described in Claims). A first gate conductor layer 21 (which is an example of a "first gate conductor layer" described in Claims) is placed in contact with the first gate insulating layer 11.

An n+ layer 5a (which is an example of a "second impurity region" described in Claims) and n+ layer 5b (which is an example of a "third impurity region" described in Claims) containing donor impurities are placed in contact with a top surface of the p-layer 4 at opposite ends in a left and right direction (hereinafter a semiconductor region containing a high concentration of donor impurities will be referred to as an "n+ layer").

There is a second gate insulating layer 13 (which is an example of a "second gate insulating layer" described in Claims) also having a concave-shaped upper part along a top surface of a recess in the p-layer 4 and part of the n+ layers 5a and 5b. The gate insulating layer 13 is placed in contact with each of the n+ layers 5a and 5b. There is a second gate conductor layer 22 (which is an example of a "second gate conductor layer" described in Claims) inside the concave-shaped upper part of the gate insulating layer 13. A top surface of the gate conductor layer 22 is located at a lower position than a top surface of the n+ layer 5a or n+ layer 5b. This is intended to cause any inversion layer formed in a MOSFET having the gate conductor layer 22 and the gate insulating layer 13 to be connected to the n+ layer 5a or the n+ layer 5b.

Whereas upper part of the gate conductor layer 22 is covered with an insulating layer 15 in FIG. 1, hereinafter the gate insulating layer 13 and the insulating layer 15 may be referred to together as the gate insulating layer 13. In FIG. 1, the upper part of the gate conductor layer 22 is covered with the insulating layer 15 for electrical isolation from interconnects above the gate conductor layer 22.

Furthermore, the n+ layer 5b is connected to a source line SL (which is an example of a "source line" described in Claims), which is a first interconnecting conductive layer, the n+ layer 5a is connected to a bit line BL (which is an example of a "bit line" described in Claims), which is a second interconnecting conductive layer, the gate conductor layer 22 is connected to a word line WL (which is an example of a "word line" described in Claims), which is a third interconnecting conductive layer, the gate conductor layer 21 is connected to a plate line PL (which is an example of a "plate line" described in Claims), which is a fourth interconnecting conductive layer, and the n-layer 3 is connected to a control line CDC (which is an example of a "control line" described in Claims), which is a fifth interconnecting conductive layer. By manipulating voltages applied the source line SL, the bit line BL, the plate line PL, the word line WL, and the control line CDC, the memory is operated.

Whereas each of figures in the concave shape in the vertical section of the p-layer 4 is illustrated by a straight line in FIG. 1, part of each figure may be U-shaped or semielliptical such that corners or a vertical section part will be curvilinear. Accordingly, a surface of the p-layer 4 will become a curved surface. Besides, bottom faces of the second gate insulating layer 13 and second gate conductor layer 22 formed in conformity with the curved surface may have curved surfaces.

Whereas the vertical sectional structure of the p-layer 4 in the memory cell has been described as being rectangular on the plane of the paper in FIG. 1, the vertical sectional structure may be trapezoidal, polygonal, circular, or elliptical.

Whereas the n+ layer 5*a* connected to the bit line BL and the n+ layer 5*b* connected to the source line SL are placed in contact with each other on a top surface of the p-layer 4 in FIG. 1, the n+ layers 5*a* and 5*b* may be placed in contact with each other on a side face of the p-layer 4. Alternatively, the n+ layers may be placed in contact with each other on both the top surface and the side face.

Whereas in FIG. 1, the first semiconductor region 1 has been described as being a p-type semiconductor, even if an n-type semiconductor substrate is used as another semiconductor substrate and a p-well is formed thereon and the memory cell of the present invention is placed using the p-well as the first semiconductor region 1, the memory cell will operate.

In a direction perpendicular to the substrate, it is sufficient if the top of the n-layer 3 is located at a level equal to or higher than the bottom of the gate conductor layer 21. During erasure of memory information, it is important that the n-layer 3 is electrically connected with an inversion layer formed in an interface between the p-layer 4 and the gate insulating layer 11 when a positive voltage is applied to the gate conductor layer 21. Also, in FIG. 1, as long as the n-layer 3 exists under the memory cell, the n-layer 3 may exist either on an entire surface of the memory cell region or part of the memory cell region in planar view. Furthermore, the n-layer 3 may be formed by an n-well in the p-layer 1.

Whereas in FIG. 1, the gate insulating layer 11 has been described as being integral with the bottom of the gate conductor layer 21 in inner lateral part, part placed in contact with the bottom of the gate conductor layer 21 and an insulating layer placed in contact with an inner lateral surface may be formed separately. In that case, the gate insulating layer 11 may vary in thickness depending on the place.

Whereas in FIG. 1, the p-layer 4 has been described as being a p-type semiconductor, an optimum value of impurity concentration of the p-layer 4 is determined depending on the quantity of residual positive holes accumulated in the memory using, as parameters, the volume of the p-layer 4, thickness of the gate insulating layer 11, material of the gate conductor layer 21, and voltage to be applied. Furthermore, the p-layer 4 may have a profile and any of the p type, n type, and i type may be used near the surface of the p-layer 4 depending on the material and thickness of the gate insulating layer 13 and the material of the gate conductor layer 22.

Any material such as an insulator, a semiconductor, or a conductor may be used under the p-layer 1 as long as the material can support the p-layer 1. The present invention is also applicable even when memory components such as a substrate 1, the p-layer 4, and the gate conductor layers 21 and 22 are formed first on another supporting substrate by extending in a horizontal direction.

The impurity concentration in the n-layer 3 may have a profile. Besides, in a direction in which the n+ layers 5*a* and 5*b* are connected with the p-layer 4, an LDD (lightly doped drain) region lower in donor impurity concentration than the n+ layers 5*a* and 5*b* may be provided between the p-layer 4 and the n+ layers 5*a* and 5*b*.

The first to fifth interconnecting conductive layers may be multi-layered as long as the layers do not contact one another.

The gate insulating layers 11 and 13 may be made of any insulating film used in a conventional MOS process, such as a $SiO_2$ film, a SiON film, a HfSiON film, or a $SiO_2$/SiN laminate film.

The first gate conductor layer 21 and the second gate conductor layer 22 may be formed, for example, of a metal such as W, Pd, Ru, Al, TiN, TaN, or WN; a nitride of the metal; an alloy thereof (including silicides); a laminated structure such as TiN/W/TaN; or a semiconductor doped at high concentration as long as a potential of part of the memory cell can be changed via the gate insulating layer 11 in the case of the first gate conductor layer 21 or via the gate insulating layer 13 in the case of the second gate conductor layer 22.

In FIG. 1, the first gate conductor layer 21 may surround the entire p-layer 4 or cover part of the p-layer 4 via the gate insulating layer 11 in planar view. The first gate conductor layer 21 may be divided into multiple parts in planar view. The first gate conductor layer 21 may be divided into multiple parts in the vertical direction. Whereas in sectional structure, the first gate conductor layer 21 exists on opposite sides of the p-layer 4 in FIG. 1, the memory of the present invention can operate as well if the first gate conductor layer 21 exists on either side of the p-layer 4.

When p+ layers, in which positive holes act as majority carriers and which are semiconductor regions containing a high concentration of acceptor impurities, are formed in place of the n+ layer 5*a* and the n+ layer 5*b*, if an n-type semiconductor is used for the p-layer 1 and the p-layer 4 and a p-type semiconductor is used for the n-layer 3, the memory of the present invention operates with electrons serving as carriers during writing.

In the actual memory device according to the first embodiment of the present invention, the memory cell described above is placed alone or a plurality of the memory cells are placed two-dimensionally on the p-layer 1.

Figure 2A:
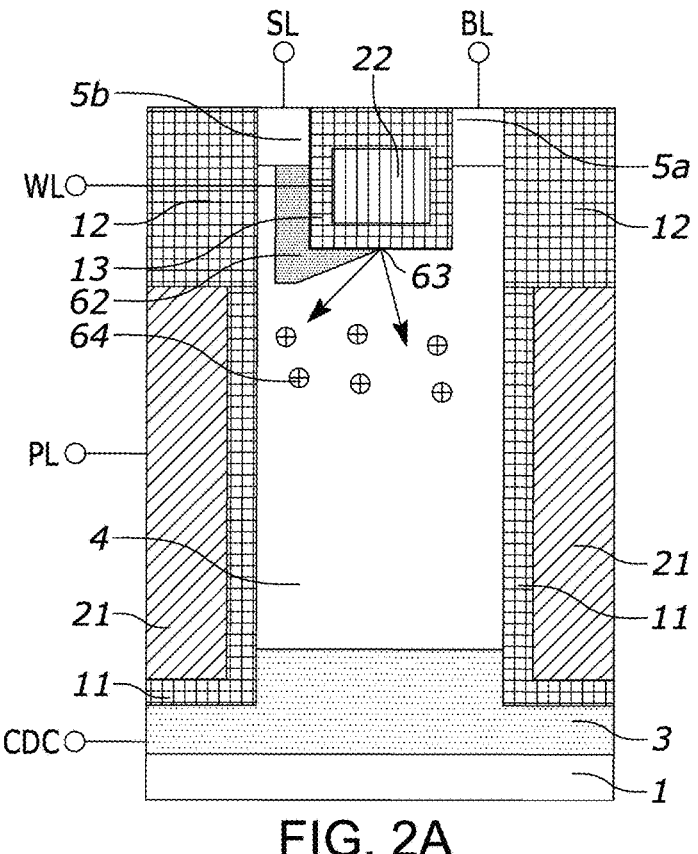
FIGS. 2A, 2B and 2C are diagrams for explaining accumulation of positive hole carriers as well as a cell current, during a write operation of the memory device according to the first embodiment, the memory device using a semiconductor element.

Carrier behavior and accumulation as well as a cell current during a write operation of the memory according to the first embodiment of the present invention will be described with reference to FIG. 2. First, description will be given of a case in which the majority carriers in the n-layer 3, the n+ layer 5*a*, and the n+ layer 5*b* are electrons, poly Si containing a high concentration of donor impurities (hereinafter poly Si containing a high concentration of donor impurities will be referred to as "n+ poly") is used, for example, for the gate conductor layer 21 connected to the plate line PL and the gate conductor layer 22 connected to the word line WL, and a p-type semiconductor is used as a second semiconductor region 4. As shown in FIG. 2A, a MOSFET in the memory cell operates using the following components: the n+ layer 5*a* that serves as a source, the n+ layer 5*b* that serves as a drain, the gate insulating layer 13, the gate conductor layer 22 that serves as a gate, and the p-layer 4 that serves as a substrate. For example, 0 V is applied to the p-layer 1, 0.5 V is applied to the n-layer 3 connected with the control line CDC, 0 V is inputted to the n+ layer 5*b* connected with the source line SL, 1.0 V is inputted to the n+ layer 5*a* connected with the bit line BL, and −1 V is applied to the gate conductor layer 21 connected with the plate line PL. It is assumed here that a threshold of a MOSFET that uses the pre-writing gate conductor layer 22 as a gate electrode is, for example, 1.0 V when the voltage of the plate line PL is −1 V. Next, if, for example, 1.5 V is inputted to the gate conductor layer 22 connected with the word line WL, a partial inversion layer 62 is formed just under the gate insulating layer 13 located below the gate conductor layer 22 with a pinch-off point 63 existing in the partial inversion layer 62. Therefore, the MOSFET having the gate conductor layer 22 operates in a saturation region.

As a result, in the MOSFET having the gate conductor layer 22, an electric field is maximized in a region between the pinch-off point 63 and the n+ layer 5a and an impact ionization phenomenon occurs in this region. As a result of the impact ionization phenomenon, electrons accelerated in a direction from the n+ layer 5b connected with the source line SL to the n+ layer 5a connected with the bit line BL collide with a Si lattice and electron-hole pairs are generated by kinetic energy of the accelerated electrons. Due to a concentration gradient, the generated positive holes diffuse in a direction in which a hole concentration is lower. As a result, positive hole groups 64 are accumulated in the p-layer 4.

In the above example, the plate line PL is set at −1 V, and this contributes to preventing a depletion layer from spreading in the p-layer 4 and thereby accumulating positive holes generated by impact ionization as well as to adjusting a threshold voltage of the MOSFET in the memory cell by means of a substrate bias effect.

In the above example, the gate conductor layer 21 is biased with a negative voltage using n+ poly, but an effect similar to application of a negative voltage can be produced using a material higher in work function than the material of the gate conductor layer 21, i.e., than the n+ poly without having to apply a voltage.

Besides, as shown in FIG. 1, a cumulative quantity of residual positive holes is increased by making the p-layer 4 wider than the second gate conductor layer 22 in planar view.

Note that positive hole groups may be generated by passing a gate induced drain leakage (GIDL) current instead of causing the impact ionization phenomenon (see, for example, J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012)).

Figure 2B:
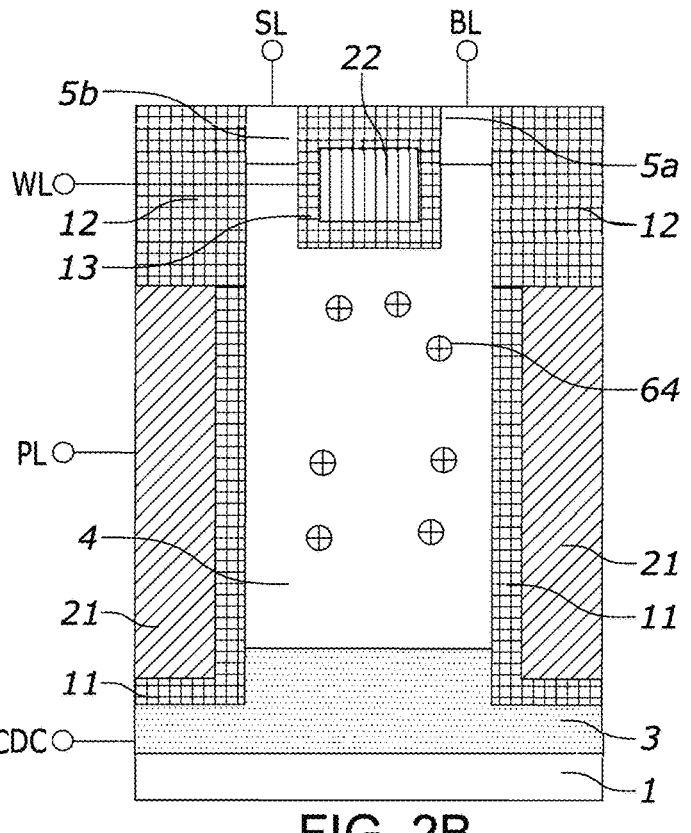
Figure 2C:
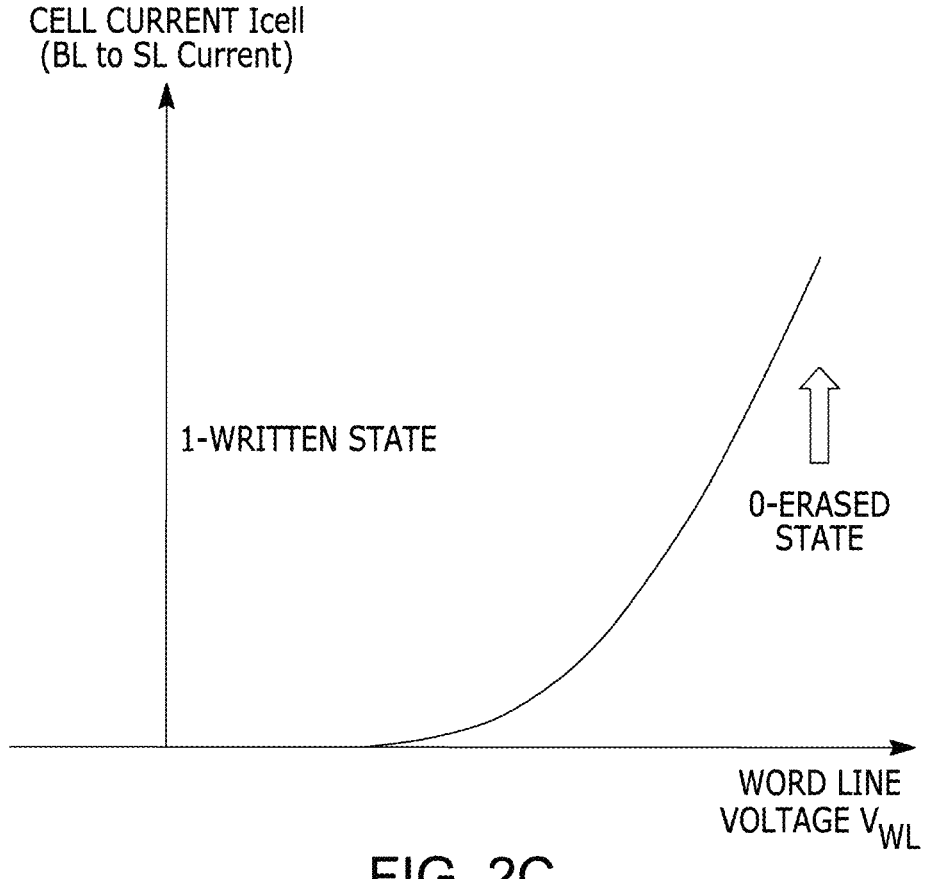

FIG. 2B shows positive hole groups 64 existing in the p-layer 4 when the plate line PL becomes-1 V, biases to the word line WL, the source line SL, and the bit line BL become 0 V, and a bias to the control line CDC becomes 0.5 V just after writing. In the generated positive hole groups 64, positive holes move due to differences in carrier concentration so as to become uniform in the p-layer 4 through diffusion. Furthermore, to apply a negative potential to the first gate conductor layer 21, the positive hole groups are accumulated in higher concentrations in the vicinity of the first gate insulating layer 11 of the p-layer 4. A threshold voltage of the MOSFET containing the gate conductor layer 22 is reduced due to a positive substrate bias effect produced by the positive holes temporarily accumulated in the p-layer 4. In the present example, as shown in FIG. 2C, the threshold voltage of the MOSFET containing the gate conductor layer 22 connected with the word line WL becomes approximately 0.6 V, which is lower than the pre-writing threshold voltage. This written state is assigned to logical storage data "1."

In addition to the above example, if the voltages applied to the bit line BL, the plate line PL, and the word line WL are denoted, for example, as V-BL, V-PL, and V-WL, respectively; assuming that SL is 0 V, voltage application conditions may be a combination of 1.0 V (V-BL)/−1 V (V-PL)/2.0 V (V-WL), 1.0 V (V-BL)/−0.5 V (V-PL)/1.2 V (V-WL), 1.5 V (V-BL)/−1 V (V-PL)/2.0 V (V-WL), or the like. The voltage relationship between the bit line BL and the source line SL may be exchanged. However, if 1.0 V is applied to the bit line BL, 0 V to the source line SL, 2 V to the word line WL, and −1 V to the plate line PL, the threshold will fall during writing, causing the pinch-off point 63 to shift gradually toward the n+ layer 5b, and consequently, the MOSFET may perform a linear operation.

Figure 3A:
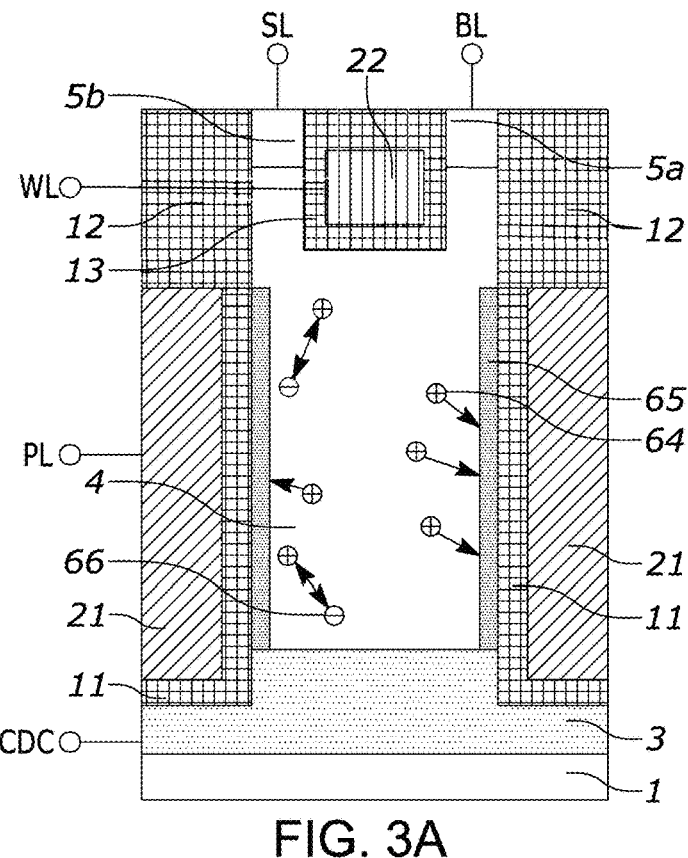
FIGS. 3A and 3B are diagrams for explaining an erase operation of the memory device according to the first embodiment, the memory device using a semiconductor element.

Next, an erase operation mechanism will be described using FIG. 3. FIG. 3A shows a state in which just after the positive hole groups 64 generated by impact ionization in the previous cycle are stored in the p-layer 4 before the erase operation. The voltages of the source line SL, bit line BL, and word line WL are 0 V, the voltage of the control line CDC is 0.5 V, and the voltage of the plate line PL is −1 V.

Figure 3B:
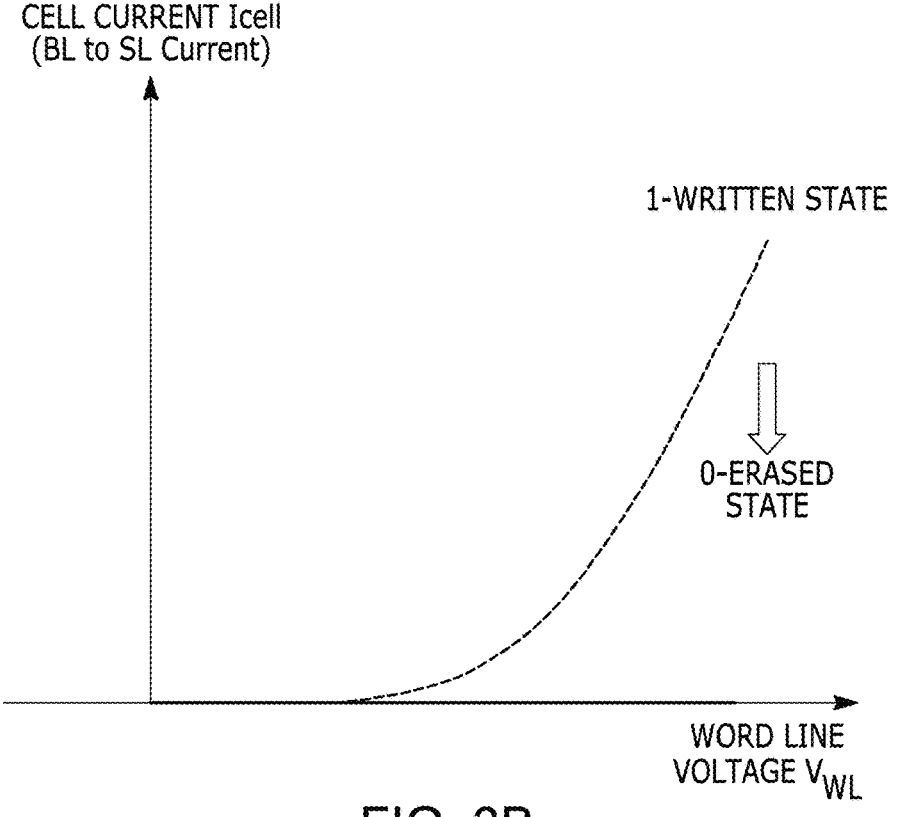

As shown in FIG. 3B, during the erase operation, the source line SL, the bit line BL, and the word line WL are set to 0 V and the voltage of the control line CDC is set to 0.5 V. The voltage of the plate line PL is set, for example, to 2 V. As a result, regardless of the value of an initial potential of the p-layer 4, an inversion layer 65 of electrons is formed in an interface between the gate insulating layer 11 and the p-layer 4. Consequently, positive holes 64 accumulated in the p-layer 4 flow from the p-layer 4 to the inversion layer 65 and recombine with electrons 66. The electrons lost as a result of the recombination are furnished from the adjoining inversion layer 65 through the n-layer 3. As a result of the recombination between the electrons and the positive holes, the hole concentration of the p-layer 4 is reduced with time, and the threshold voltage of the MOSFET becomes higher than when "1" is written. Here, for example, if the voltage of the plate line PL is −1 V, the threshold of the MOSFET becomes 1.2 V. Consequently, as shown in FIG. 3B, the MOSFET containing the gate conductor layer 22 connected to the word line WL enters an erased state in which almost no current flows even if a voltage is applied. In this state, logical storage data of the memory is "0."

With a structure of the first embodiment of the present invention, in a MOSFET region formed of the p-layer 4, the gate conductor layer 22, the gate insulating layer 13, and the n+ layers 5a and 5b, a contact area between the p-layer 4 and the gate insulating layer 13 is larger than a contact area between the gate conductor layer 22 and the gate insulating layer 13. As a result, dependence of the threshold of the MOSFET on the quantity of positive hole carriers in the p-layer 4 becomes larger than that of flat MOSFETs, increasing an operating margin of the memory.

Furthermore, since the vertical section of the p-layer 4 is concave, an effective distance between the n+ layer 5a and the n+ layer 5b is increased, making it possible to reduce a leakage current of the MOSFET when the logical storage data is "0."

In data erase methods other than the one taken as an example, if the voltages applied to the bit line BL, the plate line PL, and the word line WL are denoted, for example, as V-BL, V-PL, and V-WL; assuming that SL is 0 V and the control line CDC is 0.5 V, voltage application conditions may be a combination of 0 V (V-BL)/2 V (W-PL)/−1 V (V-WL), 0.4 V (V-BL)/2 V (V-PL)/0.5 V (V-WL), 1 V (V-BL)/1.5 V (V-PL)/0 V (V-WL), or the like. The conditions of the voltages applied to the bit line BL, the source line SL, the word line WL, and the plate line PL are only an example used in performing a memory erase operation, and other operating conditions that allow memory erase operations to be performed may be used.

Whereas the control line CDC has been described as being at 0.5 V during both memory writing and erasure, the control line CDC may be set to the ground voltage, i.e., to 0 V.

Undersurfaces of the n+ layers 5a and 5b are separated from a top surface of the gate conductor layer 21. Consequently, an inversion layer 65 formed between the p-layer 4 and the gate insulating layer 11 is kept out of direct contact with the n+ layers 5a and 5b during memory erasure. This makes it hard for current to flow from the n-layer 3 and thereby helps reduce power consumption during erasure.

Besides, according to the first embodiment of the present invention, since memory can be erased even if a positive voltage is applied to the plate line PL at the time of erasure, information in a plurality of cells sharing the gate conductor layer 22 can be erased at once.

Whereas a contact area between the p-layer 4 and the n-layer 3 is illustrated as being equal to a cross-sectional area of the p-layer 4, it is sufficient if even part of the n-layer 3 and the inversion layer 65 are in contact when the inversion layer 65 is formed during erasure, and the contact area between the p-layer 4 and the n-layer 3 may be smaller than the cross-sectional area of the p-layer 4.

Because the memory cell of the present invention is formed in the area of one MOSFET in planar view, by sharing the source line and the bit line with adjacent memory cells, a higher-density memory cell array than conventional dynamic RAMs can be implemented.

The first embodiment of the present invention has the following features.

(Feature 1)

The MOSFET, which is an access transistor of the memory according to the first embodiment of the present invention, can implement a higher-density memory cell than a conventional parallel plate (planar) type by surrounding part of the second gate conductor layer 22 with the n+ layer 5*a*, the n+ layer 5*b*, and the p-layer 4, which is to correspond to a channel.

(Feature 2)

The MOSFET, which is an access transistor of the memory according to the first embodiment of the present invention, is formed by the n+ layer 5*a*, the n+ layer 5*b*, the p-layer 4, the second gate insulating layer 13, and the second gate conductor layer 22. Since the vertical section near the surface of the p-layer 4 is concave, electric flux lines from the second gate conductor layer 22 to the p-layer 4, which corresponds to a channel of the MOSFET, are dispersed rather than being concentrated. As a result, a back-gate bias effect increases, and consequently carrier concentration dependence of a threshold of the access transistor becomes larger than that of a parallel plate (planar) type or FIN type MOSFET, thereby increasing an operating margin of the memory.

(Feature 3)

According to the first embodiment of the present invention, since the channel p-layer 4 of the MOSFET made up of the n+ layers 5*a* and 5*b*, the p-layer 4, the gate insulating layer 13, and the gate conductor layer 22 has a concave structure in vertical section, the effective distance between the n+ layer 5*a* and the n+ layer 5*b* can be made longer than width of the gate conductor layer 22 in planar view, making it possible to reduce the leakage current of the MOSFET when the memory is in off state.

(Feature 4)

According to the first embodiment of the present invention, as described in Feature 2, since an access transistor with a short gate length in planar view can be used, a high-density memory arrangement can be realized.

(Feature 5)

The p-layer 4, which is a component of the MOSFET contained in the memory cell according to the first embodiment of the present invention, is connected with the n-layer 3 and the p-layer 1, and if the voltage applied to the gate conductor layer 21 is adjusted, the threshold of the MOSFET acting as an access transistor can be set freely. Furthermore, since the components under the MOSFET are not completely depleted, coupling of a floating body with the gate electrode from a word line, which is a defect of capacitorless DRAMs, almost does not have a significant impact. That is, the present invention allows a wide margin to be provided to the operating voltage of the memory.

(Feature 6)

With the memory according to the first embodiment of the present invention, when a plurality of cells are placed in the n-layer 3 and the gate conductor layer 21 is shared, an erase operation can be performed on a plurality of cells in a single procedure.

(Feature 7)

With the memory according to the first embodiment of the present invention, the n+ layer 5*a*, the n+ layer 5*b*, the p-layer 4, the second gate insulating layer 13, and the second gate conductor layer 22, which are components of the memory, can be formed in the same process as a source, a drain, a substrate, a gate oxide film, and a gate electrode, which make up peripheral CMOS circuitry. This makes it possible to provide a high-density memory cell array and a structure compatible with the peripheral CMOS circuitry.

Second Embodiment

A method for manufacturing a memory according to the second embodiment of the present invention will be described using FIGS. 4A to 4N, where FIG. 4XA is a plan view, FIG. 4XB is a sectional view taken along line X-X' in FIG. 4XA, and FIG. 4XC is a sectional view taken along line Y-Y'.

As shown in FIG. 4A, on the p-layer 1, which is a p-type semiconductor substrate, the n-layer 3, the p-layer 4, an insulating layer 14, and a mask material layer 41 are formed. The p-layer 4 and the n-layer 3 may be well layers or may be formed using epitaxial technology by changing the type or concentration of impurities. For example, a silicon oxide film can be used for the insulating layer 14, and a silicon nitride film or the like can be used for the mask material layer 41.

Next, as shown in FIG. 4B, by using as a mask the mask material layer 41 in a region that will eventually become a transistor of the memory cell, part of the insulating layer 14, the p-layer 4, and the n-layer 3 is etched by an RIE (Reactive Ion Etching) process. Note that in FIG. 4B, it is sufficient if a bottom of an etched trench is located between upper and lower parts of the n-layer 3.

Next, as shown in FIG. 4C, the gate insulating layer 11 is formed selectively by oxidation on side walls and a bottom of the trench formed as described above. Although not illustrated, for example, an oxide film may be formed all around using ALD (atomic layer deposition) technology. In that case, the gate insulating layer 11 is formed around the mask material layer 41 as well.

Next, as shown in FIG. 4D, n+ poly-Si is deposited on an entire surface of the gate conductor layer 21, for example, by a CVD process, then etch-back is carried out by a selective RIE process, and etching is done such that an upper surface of the gate conductor layer 21 will be located at a lower position than an upper surface of the p-layer 4. Although an n+ poly film is used in the present example, another metal film such as a single layer film of W or a laminate film of TiN/W, silicide/poly, or the like may be used.

Next, as shown in FIG. 4E, an insulating layer 12 is formed on an entire surface using, for example, the CVD process. Subsequently, the insulating layer 12 is polished using CMP (chemical mechanical polishing) technology until a surface of the mask material layer 41 appears. The insulating layer 12 may be planarized by etch-back using the RIE process based on selectivity between the mask material layer 41 and the insulating layer 12.

Next, the mask material layer 41 is removed selectively, and then the insulating layer 12 is etched such that the surface of the p-layer 4 will be exposed. In so doing, using the CMP technology, part of the mask material layer 41 and the insulating layer 12 may be planarized such that the surface of the p-layer 4 will be exposed. Next, as shown in FIG. 4F, the insulating layer 15 and masking material 42 are formed on the entire surface.

Next, as shown in FIG. 4G, using the masking material 42, part of the insulating layer 15 and p-layer 4 located in a region that is to become a gate electrode of the memory cell is etched by the RIE process. Next, the gate insulating layer 13 is formed selectively by oxidation on the side walls and bottom of the trench formed as described above. Although not illustrated, an oxide film may be formed all around using, for example, the ALD technology. In that case, the gate insulating layer 13 is formed also around the masking material 42.

Next, as shown in FIG. 4H, an n+ poly film is formed on the entire surface and then etched back. Consequently, n+ poly film remains in the trench and is formed as a gate conductor layer 22. In this case, it is necessary to etch back a surface of the gate conductor layer 22 to a position lower than a surface of the insulating layer 12. Although an n+ poly film is used in the present example, another metal film such as a single layer film of W or a laminate film of TiN/W, silicide/poly, or the like may be used. The gate conductor layer 22 is also used as a gate electrode in all or part of the peripheral CMOS circuitry.

Next, as shown in FIG. 4I, the insulating layer 15 is formed on the entire surface using, for example, the CVD process. Subsequently, the insulating layer 15 is polished using the CMP technology until the surface of the masking material 42 appears. The insulating layer 15 may be planarized by etch-back using the RIE process based on selectivity between the masking material 42 and the insulating layer 15.

Next, as shown in FIG. 4J, the insulating layer 15 and the masking material 42 are polished using the CMP technology until the surface of the p-layer 4 appears. As a result, the insulating layer 15 remains on upper part of the gate conductor layer 22.

Next, as shown in FIG. 4K, the n+ layer 5a and the n+ layer 5b are formed in a self-aligning manner from the exposed surface of the p-layer 4. This formation method uses commonly known ion injection, vapor-phase-based impurity injection, heat treatment that involves activating impurities as carriers, or laser annealing.

Next, as shown in FIG. 4L, a W film 33 is formed on the entire surface and processed to obtain a desired interconnect structure. As a result, adjacent n+ layers 5a or adjacent n+ layers 5b are connected together. Although a W film 33 is used in the present example, another metal film, a single layer film of silicide or poly, a laminate film, or the like may be used as long as the material can be placed in contact with the n+ layer 5a or 5b. Alternatively, although not illustrated, instead of this interconnect method, a method may be adopted which involves forming a conventional insulating layer on the entire surface, opening contact holes in the n+ layer 5a or 5b, and using a metal layer for interconnection.

Next, as shown in FIG. 4M, an insulating layer 55 is formed on the entire surface and then a contact hole 34 is opened in each of the memory cells. Subsequently, an interconnecting conductor layer 35 is formed. The interconnect layer 33, which is not seen from the top, is indicated by chain double-dashed lines in FIG. 4MA to make positional relationships easier to understand.

Next, as shown in FIG. 4N, an insulating layer 56 is formed on the entire surface and then a contact hole 36 is opened in each of the memory cells. Subsequently, an interconnecting conductor layer 37 is formed. As a result, the interconnecting conductor layer 35 is connected to the source line SL. The interconnecting conductor layer 37 is connected to the bit line BL.

Note that in the plan view of FIG. 4NA, only the second interconnecting conductor layer 37 and the insulating layer 56 are actually visible on the upper part, but major components in lower layers—the n+ layers 5a and 5b, the gate conductor layer 22, the metal layer 33, the contact holes 34, and the interconnecting conductor layer 35—are illustrated in FIG. 4NA to facilitate understanding.

In FIGS. 4A to 4N, although the trench has been illustrated as having a rectangular vertical section, the shape of the trench may be trapezoidal or circular.

Futuristically, it is sufficient that the n-layer 3 exists where there is a memory cell. Therefore, although the n-layer 3 is illustrated as being formed all over the p-layer 1 in FIG. 4A, the n-layer 3 may be formed only in selected regions on the p-layer 1.

The gate insulating layer 11 and the gate insulating layer 13 may be made of any insulating film used in a conventional MOS process, such as a $SiO_2$ film, a SiON film, a HfSiON film, or a $SiO_2$/SiN laminate film.

Whereas description has been given herein of a method that involves separately forming the interconnecting conductor layer 35 and interconnecting conductor layer 37 to be connected to the line BL, the interconnecting conductor layers 35 and 37, and the contact holes 34 and 36 can be formed in a single process using a damascene process.

The present embodiment provides the following features.

(Feature 1)

Since the method for manufacturing a memory according to the second embodiment of the present invention can use a wafer used in a conventional MOS process, no material cost is newly added. Since no special process such as a selective epitaxial process described in US 2023/0077140 A1 is required, the present method is compatible with a typical generalized MOS process and is easy to introduce.

(Feature 2)

With the method for manufacturing a memory according to the second embodiment of the present invention, of the memory cell shown in FIG. 4N, the n+ layer 5a, the interconnecting conductor layers 35 and 37 connected to the bit line BL, and the contact holes 34 and 36 are shared among adjacent cells. The interconnecting conductor layer 35 connected to the source line SL as well as the contact holes 34 are also shared among adjacent cells. Therefore, the present invention can provide a fine memory cell.

(Feature 3)

With the method for manufacturing a memory according to the second embodiment of the present invention, as shown in FIG. 4L, contacts between the interconnects and the n+ layer 5a or 5b in the memory cell are formed in a self-aligning manner, making it possible to reduce the number of masks. Furthermore, lateral length of the contacts can be determined regardless of machining accuracy of lithography, making it possible to form fine-sized contacts, thereby contributing to miniaturization of memory.

INDUSTRIAL APPLICABILITY

The present invention can provide a semiconductor memory device higher in density, speed, and operating margin than conventional semiconductor memory devices.

What is claimed is:

1. A semiconductor memory cell comprising:

a first semiconductor region;

a first impurity region formed on the first semiconductor region;

a second semiconductor region formed in a vertical direction in contact with the first impurity region, wherein the second semiconductor region is formed to have a recess in its top surface;

a first gate insulating layer formed to surround part of the second semiconductor region;

a first gate conductor layer formed in contact with the first gate insulating layer;

a second gate insulating layer formed along an interior surface of the recess of the second semiconductor region, wherein the second gate insulating layer is formed to have a second recess in its top surface;

a second gate conductor layer formed inside the second recess of the second gate insulating layer; and a second impurity region and a third impurity region formed separately in contact with the top surface of the second semiconductor region, wherein the second gate conductor layer has a top surface located lower than top surfaces of the second impurity region and the third impurity region, and further wherein a charge type of majority carriers in the second semiconductor region is identical to a charge type of majority carriers in the first semiconductor region.

2. The semiconductor memory cell according to claim 1, wherein the second impurity region and the third impurity region are formed in contact with the second gate insulating layer.

3. The semiconductor memory cell according to claim 1, wherein one or both of (i) a contact surface between the second semiconductor region and the second impurity region and (ii) a contact surface between the second semiconductor region and the third impurity region are located higher than a bottom of the second gate insulating layer.

4. The semiconductor memory cell according to claim 1, further comprising an insulating layer formed between the second impurity region and the third impurity region.

5. The semiconductor memory cell according to claim 1, wherein a minimum distance between the second impurity region and the third impurity region is larger than a horizontal length of a vertical section of the second gate conductor layer.

6. The semiconductor memory cell according to claim 1, wherein a charge type of majority carriers in the first impurity region is different from a charge type of majority carriers in the first semiconductor region.

7. The semiconductor memory cell according to claim 1, wherein a charge type of majority carriers in the second impurity region and the third impurity region is identical to a charge type of majority carriers in the first impurity region.

8. The semiconductor memory cell according to claim 1, wherein the first impurity region is shared by a plurality of adjacent memory cells.

9. The semiconductor memory cell according to claim 1, wherein the second impurity region or the third impurity region is shared by a plurality of adjacent memory cells.

10. The semiconductor memory cell according to claim 1, wherein a top surface of the first impurity region is formed higher than a lower surface of the first gate insulating layer.

11. The semiconductor memory cell according to claim 1, wherein lower surfaces of the second impurity region and the third impurity region are formed higher than a top surface of the first gate insulating layer.

12. The semiconductor memory cell according to claim 1, wherein a threshold of a MOS transistor made up of the second semiconductor region, the second impurity region, the third impurity region, the second gate insulating layer, and the second gate conductor layer is varied by changing a voltage applied to the first gate conductor layer.

13. The semiconductor memory cell according to claim 1, further comprising:

a first interconnecting conductor layer connected to the second impurity region;

a second interconnecting conductor layer connected to the third impurity region;

a third interconnecting conductor layer connected to the second gate conductor layer;

a fourth interconnecting conductor layer connected to the first gate conductor layer; and a fifth interconnecting conductor layer connected to the first impurity region, wherein a memory write operation is performed by controlling voltages applied to the first interconnecting conductor layer, the second interconnecting conductor layer, the third interconnecting conductor layer, the fourth interconnecting conductor layer, and the fifth interconnecting conductor layer and performing an operation of generating electron groups and positive hole groups in the second semiconductor region, by an impact ionization phenomenon or a gate induced drain leakage current using a current passed between the second impurity region and the third impurity region, an operation of removing minority carriers in the second semiconductor region among the generated electron groups and the positive hole groups, and an operation of causing part or all of majority carriers in the second semiconductor region to remain in the second semiconductor region, and a memory erase operation is performed by controlling voltages applied to the first interconnecting conductor layer, the second interconnecting conductor layer, the third interconnecting conductor layer, the fourth interconnecting conductor layer, and the fifth interconnecting conductor layer and extracting majority carriers remaining in the second semiconductor region from at least one of the first impurity region, the second impurity region, and the third impurity region by recombining the majority carriers with majority carriers in the first impurity region, the second impurity region, and the third impurity region.

14. The semiconductor memory cell according to claim 13, wherein:

the first interconnecting conductor layer connected to the second impurity region is a source line;

the second interconnecting conductor layer connected to the third impurity region is a bit line, the third interconnecting conductor layer connected to the second gate conductor layer is a word line;

the fourth interconnecting conductor layer connected to the first gate conductor layer is a plate line;

the fifth interconnecting conductor layer is a control line; and the memory write operation and the memory erase operation are performed by applying voltages to the source line, the bit line, the plate line, the word line, and the control line.

* * * * *